(12) United States Patent
Yun et al.

(10) Patent No.: US 11,776,642 B2
(45) Date of Patent: Oct. 3, 2023

(54) MEMORY DEVICE INCLUDING MASSBIT COUNTER AND METHOD OF OPERATING THE SAME

(71) Applicant: Samsung Electronics Co., Ltd., Suwon-si (KR)

(72) Inventors: Sung-Won Yun, Suwon-si (KR); Han-Jun Lee, Gunpo-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/548,774

(22) Filed: Dec. 13, 2021

(65) Prior Publication Data

US 2022/0101931 A1 Mar. 31, 2022

Related U.S. Application Data

(60) Continuation of application No. 17/493,063, filed on Oct. 4, 2021, now Pat. No. 11,594,294, which is a (Continued)

(30) Foreign Application Priority Data

Nov. 13, 2017 (KR) .................. 10-2017-0150703

(51) Int. Cl.
*G11C 16/34* (2006.01)
*G11C 11/56* (2006.01)
(Continued)

(52) U.S. Cl.
CPC ........ *G11C 16/349* (2013.01); *G11C 11/5628* (2013.01); *G11C 16/08* (2013.01);
(Continued)

(58) Field of Classification Search
CPC ....... G11C 16/349; G11C 16/08; G11C 16/10; G11C 16/26; G11C 16/3404;
(Continued)

(56) References Cited

U.S. PATENT DOCUMENTS 6,751,158 B2   6/2004  Ryoo
7,551,487 B2   6/2009  Park et al.
(Continued)

FOREIGN PATENT DOCUMENTS

CN    106448733 A    2/2017
CN    107068190 A    8/2017
(Continued)

OTHER PUBLICATIONS

Notice of Allowance in U.S. Appl. No. 17/493,063 dated Oct. 26, 2022.
(Continued)

*Primary Examiner* — Sultana Begum
(74) *Attorney, Agent, or Firm* — HARNESS, DICKEY & PIERCE, P.L.C.

(57) ABSTRACT

A method of operating a memory device that includes a plurality of stages each having a plurality of page buffers. The method including performing a verify operation of a first program loop from among a plurality of program loops, the verify operation of the first program loop including, performing a first off-cell counting operation on a first stage of the plurality of stages based on a first sampling rate to generate a first off-cell counting result; selectively changing the first sampling rate based on the first off-cell counting result to generate a changed first sampling rate; and performing a second off-cell counting operation on a second stage of the plurality of stages based on one of the first sampling rate and the changed first sampling rate to generate a second off-cell counting result.

20 Claims, 27 Drawing Sheets

Related U.S. Application Data continuation of application No. 16/806,398, filed on Mar. 2, 2020, now Pat. No. 11,164,646, which is a division of application No. 16/009,523, filed on Jun. 15, 2018, now Pat. No. 10,629,279.

(51) Int. Cl.
  *G11C 16/08* (2006.01)
  *G11C 16/26* (2006.01)
  *G11C 16/10* (2006.01)
  *G11C 29/02* (2006.01)
  *G11C 16/04* (2006.01)

(52) U.S. Cl.
  CPC .............. *G11C 16/10* (2013.01); *G11C 16/26* (2013.01); *G11C 16/3404* (2013.01); *G11C 16/3459* (2013.01); *G11C 29/021* (2013.01); *G11C 29/028* (2013.01); *G11C 16/0483* (2013.01)

(58) Field of Classification Search
  CPC ............ G11C 16/3459; G11C 16/0483; G11C 11/5628; G11C 29/021; G11C 29/028
  See application file for complete search history.

(56) References Cited

U.S. PATENT DOCUMENTS

| | | |
|---|---|---|
| 8,773,908 B2 | 7/2014 | Song et al. |
| 9,305,651 B1 | 4/2016 | Tam |
| 10,061,633 B2 | 8/2018 | Yim et al. |
| 2008/0002468 A1* | 1/2008 | Hemink ............... G11C 16/349 |
| | | 714/E11.038 |
| 2009/0143884 A1 | 6/2009 | Chieng et al. |
| 2012/0269002 A1 | 10/2012 | Yoon et al. |
| 2012/0314500 A1 | 12/2012 | Song et al. |
| 2013/0028018 A1 | 1/2013 | Cho et al. |
| 2015/0131376 A1 | 5/2015 | Tsang et al. |
| 2016/0148695 A1 | 5/2016 | Kim |
| 2016/0148703 A1 | 5/2016 | Kim et al. |
| 2016/0259674 A1* | 9/2016 | Han ..................... G06F 11/073 |
| 2017/0117055 A1 | 4/2017 | Kim et al. |
| 2017/0168891 A1 | 6/2017 | Park |
| 2018/0261291 A1 | 9/2018 | Nagao |
| 2021/0335431 A1 | 10/2021 | Choi et al. |
| 2022/0044746 A1 | 2/2022 | Hsu |

FOREIGN PATENT DOCUMENTS

| | | | |
|---|---|---|---|
| KR | 10-0706816 | B1 | 4/2007 |
| KR | 10-0965077 | B1 | 6/2010 |
| KR | 10-2015-0019722 | A | 2/2015 |
| KR | 10-2016-0060917 | A | 5/2016 |
| KR | 10-2017-0020658 | A | 2/2017 |
| KR | 10-2017-0085776 | A | 7/2017 |
| KR | 10-2341261 | B9 | 12/2021 |

OTHER PUBLICATIONS

Grant of Patent issued on Nov. 24, 2021 in Korean Application No. 10-2017-0150703.

Office Action dated Feb. 23, 2023 in Chinese Application No. 201811249889.1.

* cited by examiner

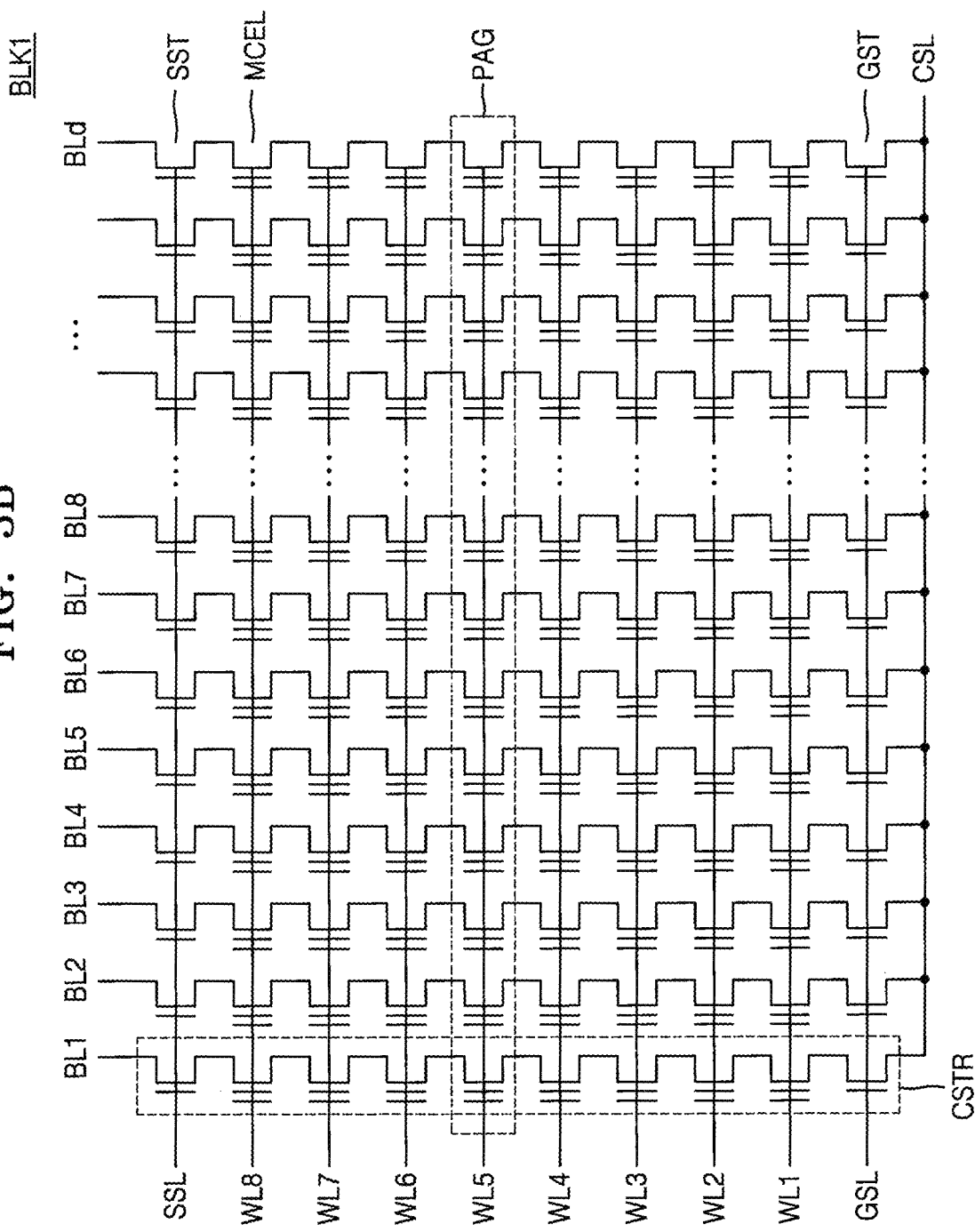

[1st Section]

[2nd Section]

| | CNT_CS<br>(BASED ON REF_<br>SAMPLING RATE, 1:2*Ra) |
|---|---|
| A | NUM_Aa |
| B | NUM_Ba |
| C | NUM_Ca |
| D | NUM_Da |
| E | NUM_Ea |
| F | NUM_Fa |
| G | OF |

| | CNT_CS<br>(BASED ON REF_SCALING<br>RATIO, 1:2*Rb) |
|---|---|
| A | NUM_Ab |
| B | NUM_Bb |
| C | NUM_Cb |
| D | NUM_Db |
| E | NUM_Eb |
| F | NUM_Fb |
| G | OF |

FIG. 9A

| | CNT_RS (BASED ON REF. SAMPLING RATE, 1:2Ra) | CNT_RS (BASED ON SAMPLING RATE, 1:Ra) | CNT_RS (BASED ON SAMPLING RATE, 1:4Ra) |
|---|---|---|---|
| A | NUM_Aa | (NUM_Aa)/2 | 2*NUM_Aa |
| B | NUM_Ba | (NUM_Ba)/2 | 2*NUM_Ba |
| C | NUM_Ca | (NUM_Ca)/2 | 2*NUM_Ca |
| D | NUM_Da | (NUM_Da)/2 | 2*NUM_Da |
| E | NUM_Ea | (NUM_Ea)/2 | 2*NUM_Ea |
| F | NUM_Fa | (NUM_Fa)/2 | 2*NUM_Fa |
| G | OF | OF | OF |

| | CNT_RS (BASED ON REF_SCALING RATIO, 1:2Rb) | CNT_RS (BASED ON SCALING RATIO, 1:Rb) | CNT_RS (BASED ON SCALING RATIO, 1:4Rb) |
|---|---|---|---|
| A | NUM_Ab | (NUM_Ab)/2 | 2*NUM_Ab |
| B | NUM_Bb | (NUM_Bb)/2 | 2*NUM_Bb |
| C | NUM_Cb | (NUM_Cb)/2 | 2*NUM_Cb |
| D | NUM_Db | (NUM_Db)/2 | 2*NUM_Db |
| E | NUM_Eb | (NUM_Eb)/2 | 2*NUM_Eb |
| F | NUM_Fb | (NUM_Fb)/2 | 2*NUM_Fb |
| G | OF | OF | OF |

TB_4

| CNT_RS_1 | Sampling rate_2 |
|---|---|
| NUM_1~NUM_2 | SR_1a |
| NUM_2~NUM_3 | SR_2a |
| NUM_3~NUM_4 | SR_3a |
| ⋮ | ⋮ |
| NUM_n-1~NUM_n | SR_na |

FIG. 23B

| CNT_RS_1 | AMP Ratio_2 |
|---|---|
| NUM_1~NUM_2 | AR_1a |
| NUM_2~NUM_3 | AR_2a |
| NUM_3~NUM_4 | AR_3a |
| ⋮ | ⋮ |
| NUM_n-1~NUM_n | AR_na |

| CNT_RS_1 | Sampling rate_2 | AMP Ratio_2 |
|---|---|---|
| NUM_1~NUM_2 | SR_1b | AR_1b |
| NUM_2~NUM_3 | SR_2b | AR_2b |
| NUM_3~NUM_4 | SR_3b | AR_3b |
| ⋮ | ⋮ | ⋮ |
| NUM_n-1~NUM_n | SR_nb | AR_nb |

TB_5c

MEMORY DEVICE INCLUDING MASSBIT COUNTER AND METHOD OF OPERATING THE SAME

CROSS-REFERENCE TO RELATED APPLICATION

This application is a continuation application of U.S. application Ser. No. 17/493,063 filed on Oct. 4, 2021, which is a continuation application of U.S. application Ser. No. 16/806,398, filed on Mar. 2, 2020, which is a divisional application of U.S. application Ser. No. 16/009,523, filed on Jun. 15, 2018, which claims the benefit of Korean Patent Application No. 10-2017-0150703, filed on Nov. 13, 2017, in the Korean Intellectual Property Office, the disclosure of each of which is incorporated herein in its entirety by reference.

BACKGROUND

Example embodiments of the inventive concepts relate to a memory device including a massbit counter. For example, at least some example embodiments relate to a memory device including a massbit counter for precisely or roughly counting the number of off-cells according to a memory operation and/or a method of operating the memory device.

A semiconductor memory device is a memory device embodied by using a semiconductor such as silicon (Si), germanium (Ge), gallium arsenide (GaAs), or indium phosphide (InP). Semiconductor memory devices may be roughly classified into volatile memory devices and nonvolatile memory devices.

In particular, nonvolatile memory devices such as flash memory devices are used in various fields due to their high operating speed, low power consumption, low noise, and high capacity. In order to determine the program states of memory cells, a nonvolatile memory device may count the number of off-cells (or on-cells) from among the memory cells by using a desired (or, alternatively, a predetermined) verify voltage. A threshold voltage distribution shape of the memory cells and characteristics of the memory cells may be determined by using the counted number of the off-cells, and the nonvolatile memory device may perform a memory operation such as a program operation or a read operation based on the determined threshold voltage distribution shape and characteristics of the memory cells.

However, conventionally it may be difficult to vary the preciseness of the measurement of the threshold voltage distribution shape and characteristics of memory cells based on the specific memory operation.

SUMMARY

Example embodiments of the inventive concepts provide a memory device including a massbit counter for adjusting an accuracy of an off-cell counting result by precisely or roughly performing off-cell counting according to a memory operation and a method of operating the memory device.

According to an example embodiments of the inventive concepts, there is provided a method of operating a memory device, the memory device including a plurality of stages each having a plurality of page buffers. The method including performing a verify operation of a first program loop from among a plurality of program loops, the verify operation of the first program loop including, performing a first off-cell counting operation on a first stage of the plurality of stages based on a first sampling rate to generate a first off-cell counting result; selectively changing the first sampling rate based on the first off-cell counting result to generate a changed first sampling rate; and performing a second off-cell counting operation on a second stage of the plurality of stages based on one of the first sampling rate and the changed first sampling rate to generate a second off-cell counting result.

According to another example embodiment of the inventive concepts, there is provided a method of operating a memory device including a plurality of stages each having a plurality of page buffers. The method including performing a verify operation of a first program loop from among a plurality of program loops, the verify operation of the first program loop including, performing a first off-cell counting operation on a first stage of the plurality of stages based on a first scaling ratio to generate a first off-cell counting result; selectively changing the first scaling ratio based on the first off-cell counting result to generate a changed first scaling ratio; and performing a second off-cell counting operation on a second stage of the plurality of stages based on one of the first scaling ratio or the changed first scaling ratio to generate a second off-cell counting result.

According to another example embodiment of the inventive concepts, there is provided a memory device including a memory cell array including a plurality of memory cells; a page buffer circuit including a plurality of stages each having a plurality of page buffers, the plurality of page buffers being connected to the memory cell array via bit lines; and processing circuitry configured to control a plurality of program loops performed on the plurality of memory cells such that, during a verify operation of a first program loop of the plurality of program loops, the processing circuitry being configured to perform massbit counting by performing a plurality of off-cell counting operations according to stages based on a first sampling rate to generate a result for each of the plurality of off-cell counting operations, and selectively changing the first sampling rate based on the result of at least one of the plurality of off-cell counting operations.

According to another example embodiment of the inventive concepts, there is provided a memory device including a memory cell array including a plurality of memory cells; a page buffer circuit including a plurality of stages each having a plurality of page buffers connected to the memory cell array via bit lines; and processing circuitry configured to control a plurality of program loops performed on the plurality of memory cells such that, during a verify operation of any one of the plurality of program loops, the processing circuitry is configured to perform massbit counting by, performing a plurality of off-cell counting operations according stages based on a variable scaling ratio to generate a result in each of the plurality of stages, and varying the variable scaling ratio based on the result of at least one of the plurality of off-cell counting operations.

According to another example embodiment of the inventive concepts, there is a provided a method of operating a memory device, the memory device including a plurality of memory cells. The method including applying a dummy read voltage to dummy to-be-read memory cells from among the plurality of memory cells; performing first off-cell counting on the dummy to-be-read memory cells based on a first sampling rate and a first scaling ratio to generate a first off-cell counting result; setting a second sampling rate and a second scaling ratio based on the first off-cell counting result; and performing a read operation on target memory cells from among the plurality of memory cells based on the second sampling rate and the second scaling ratio.

BRIEF DESCRIPTION OF THE DRAWINGS

Example embodiments of the inventive concepts will be more clearly understood from the following detailed description taken in conjunction with the accompanying drawings in which:

FIG. 3B is a circuit diagram of a memory block included in the memory cell array of FIG. 3A according to an example embodiment;

FIGS. 8B through 8D are diagrams for explaining a method of generating an off-cell counting result by using a stage verify signal received from a stage;

FIG. 9A is a diagram for explaining a method of generating an off-cell counting result when a sampling rate is changed;

FIG. 9B is a diagram for explaining a method of generating an off-cell counting result when a scaling ratio is changed;

FIG. 22 is a diagram for explaining a dummy read operation performed before a read operation is performed;

FIGS. 23A through 23C are diagrams illustrating table information that are referred to in order to set a second sampling rate and a second scaling ratio on which second off-cell counting is based according to an example embodiment;

DETAILED DESCRIPTION

Example embodiments of the inventive concepts will now be described more fully with reference to the accompanying drawings, in which some example embodiments are shown.

Figure 1:
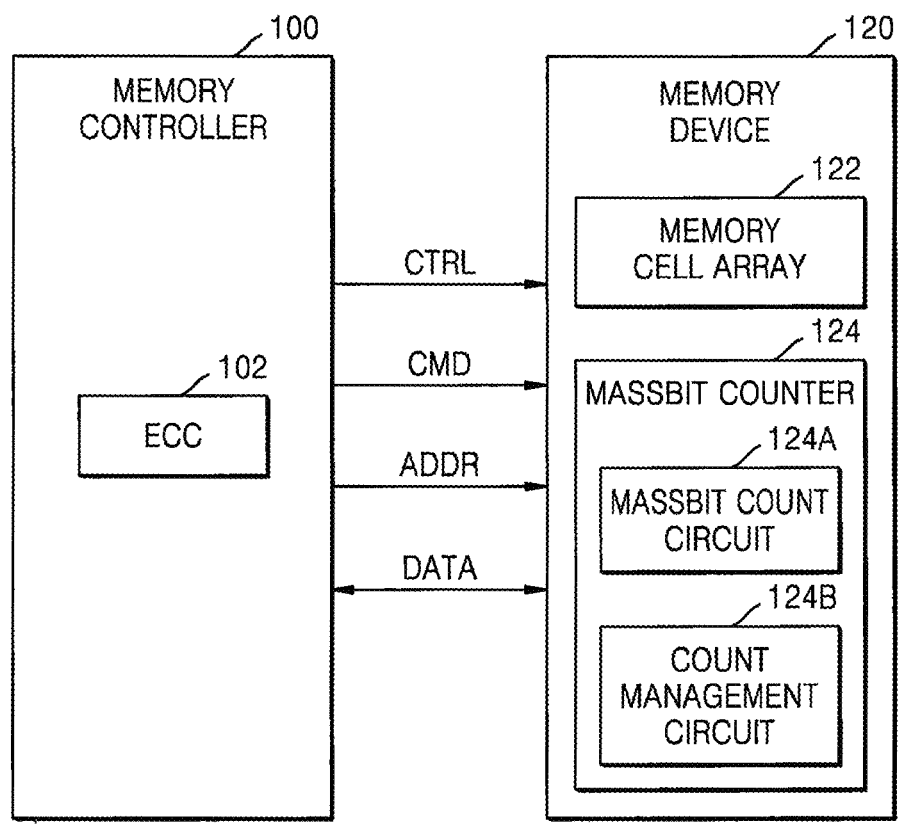
FIG. 1 is a block diagram of a memory system according to an example embodiment.

FIG. 1 is a block diagram of a memory system 10 according to an example embodiment.

Referring to FIG. 1, the memory system 10 that is a non-volatile memory system may include a memory controller 100 and a memory device 120.

The memory system 10 may be implemented as one chip, one semiconductor package, or one module such that each of the memory controller 100 and the memory device 120 may be implemented as one chip, one semiconductor package, or one module. However, example embodiments are not limited thereto. For example, each of the memory controller 100 and the memory device 120 may be implemented as separate chips.

The memory system 10 may be connected to an external device (e.g., a host or an application processor) and may be used as a storage medium of the external device. The memory system 10 may be a large capacity storage medium such as a memory card, a memory stick, or a solid-state drive (SSD).

The memory controller 100 may control the memory device 120 under the control of the external device. The memory controller 100 may transmit an address ADDR and a command CMD to the memory device 120, or may transmit/receive data DATA and a control signal CTRL to/from the memory device 120.

The memory controller 100 may include an error correction circuit 102. The error correction circuit 102 may detect and correct an error of the data DATA read from the memory device 120. For example, the error correction circuit 102 may generate an error correction code for data to be programmed to the memory device 120. The error correction circuit 102 may read data from the memory device 120, detect an error of the data based on an error correction code for the data, and may correct the error. The error correction circuit 102 may detect and correct error bits within an error correctable range.

The memory device 120 may perform a memory operation under the control of the memory controller 100. The memory operation may include not only a program operation, a read operation, and an erase operation but also operations based on a read defence code for determining a desired (or, alternatively, an optimal) read voltage, a program loop, and control of a program voltage level. For example, the memory device 120 may program or read the data DATA in response to a signal received from the memory controller 100.

The memory device 120 may include a memory cell array 122 including a plurality of memory cells, and a massbit counter 124. The memory cell array 122 may be a NAND flash memory cell array or a NOR flash memory cell array. The following will be described assuming that the plurality of memory cells are NAND flash memory cells. However, example embodiments of the inventive concepts are not limited thereto, and in another example embodiment, the plurality of memory cells may be resistive memory cells such as resistive random-access memories (RRAMs), phase-change random-access memories (PRAMs), or magnetic random-access memories (MRAMs), or furthermore, may be volatile memory cells such as dynamic random-access memories (DRAMs).

The massbit counter 124 may perform a program operation on the memory cells of the memory cell array 122, and then may perform an off-cell counting operation for counting the number of off-cells by using a desired (or, alternatively, predetermined) verify voltage (or a read voltage). Hereinafter, the off-cell counting operation performed by the massbit counter 124 may be referred to as a massbit counting operation. In an example embodiment, when an off-cell counting operation is performed, the massbit counter 124 may adjust an accuracy of the counted number of off-cells according to a memory operation. For example, when a first memory operation is performed, the massbit counter 124 may roughly count the number of off-cells through a simple and fast calculation, although an accuracy of the counted number of the off-cells is slightly low. Also, when a second memory operation is performed, the massbit counter 124 may precisely count the number of off-cells to increase an accuracy of the counted number of off-cells.

In an example embodiment, the massbit counter 124 may include a massbit count circuit 124A and a count management circuit 124B. When a verify voltage (or a read voltage) is applied to the memory cell array 122, the massbit count circuit 124A may count the number of off-cells by using verify signals output from the memory cell array 122. The massbit count circuit 124A may count the number of off-cells based on a parameter (or a massbit counting operation-related parameter) for adjusting an accuracy of the number of off-cells as described above.

In an example embodiment, the count management circuit 124B may change a value of the parameter according to a memory operation performed by the memory device 120. Also, the count management circuit 124B may determine an appropriate value of the parameter by changing values of desired (or, alternatively, predetermined) parameters based on an off-cell counting result generated from the massbit count circuit 124A. The parameter may include at least one of a sampling rate and a scaling ratio. A detailed operation of the massbit counter 124 will be described below.

The memory device 120 according to example embodiment of the inventive concepts may adaptively perform a memory operation that requires a rough massbit counting operation and a memory operation that requires a precise massbit counting operation, by adjusting an accuracy of a massbit counting operation according to a memory operation.

Figure 2:
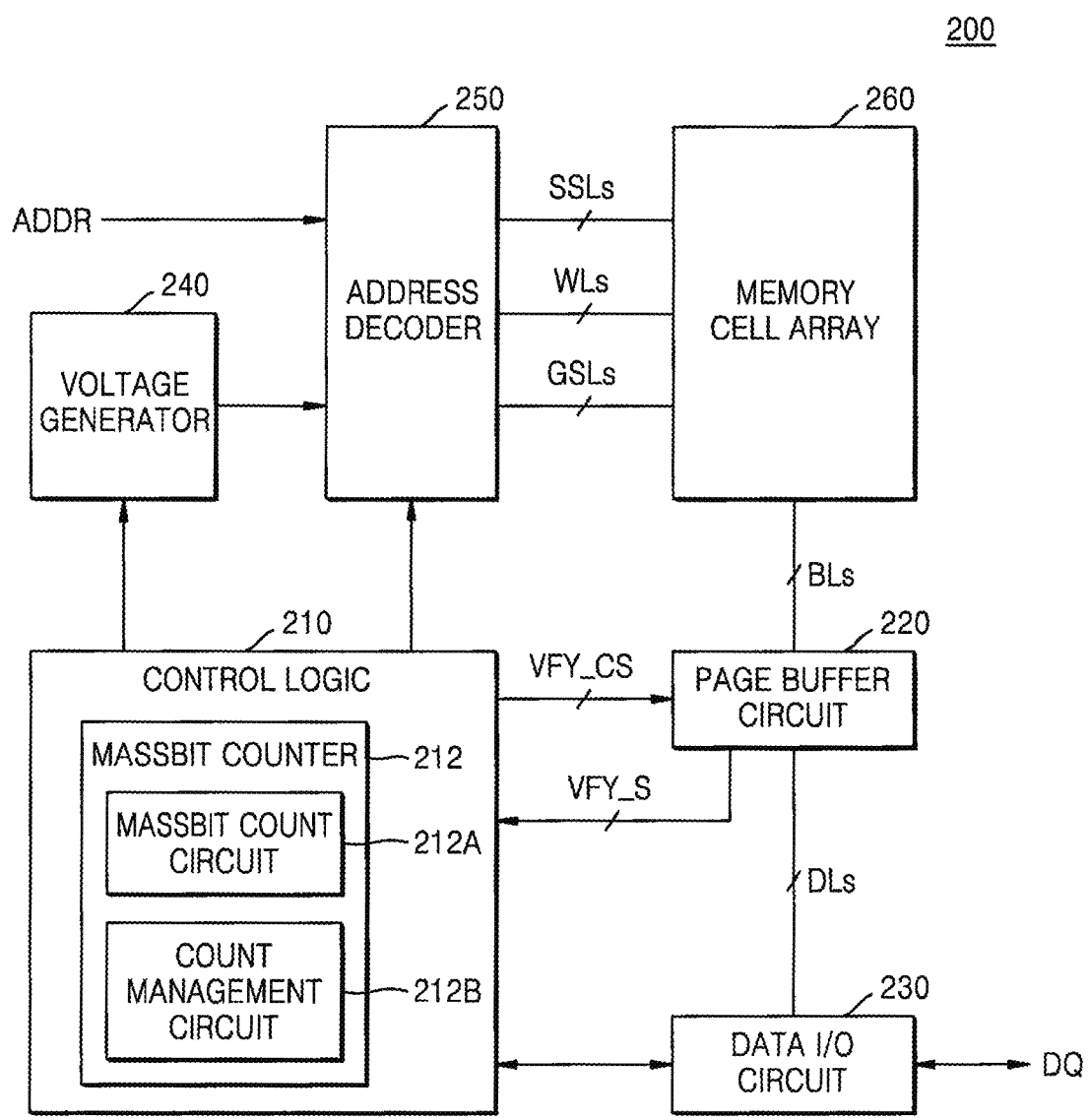
FIG. 2 is a block diagram illustrating an example of a memory device included in the memory system of FIG. 1.

FIG. 2 is a block diagram illustrating an example of the memory device 120 included in the memory system 10 of FIG. 1.

Referring to FIG. 2, a memory device 200 may include a control logic 210, a page buffer circuit 220, a data input/output circuit 230, a voltage generator 240, an address decoder 250, and a memory cell array 260.

The memory cell array 260 may be connected to the address decoder 250 through word lines WLs, string select lines SSLs, and ground select lines GSLs, and may be connected to the data input/output circuit 230 through bit lines BLs. The memory cell array 260 may include a plurality of memory blocks. The memory cell array 260 may include a plurality of NAND cell strings. Each of the NAND cell strings may form a vertical or horizontal channel. A plurality of word lines may be vertically stacked in the memory cell array 260. Each word line may form control gates of memory cells included in a cell string. In this case, a memory cell channel may be vertically formed.

The address decoder 250 may select any one from among the word lines WLs of the memory cell array 260 by decoding an address. The address decoder 250 may apply a program voltage supplied from the voltage generator 240 to the selected word line of the memory cell array 260 during a program operation. Also, the address decoder 250 may apply a verify voltage or a read voltage supplied from the voltage generator 240 to the selected word line of the memory cell array 260 during a verify operation or a read operation.

The page buffer circuit 220 may operate as a program driver or a sense amplifier according to an operation performed by the control logic 210. During a program operation, the page buffer circuit 220 may apply a voltage corresponding to data to be programmed to the bit lines BLs of the memory cell array 260. During a read operation, the page buffer circuit 220 may sense data programmed to a selected memory cell through the bit lines BLs and may apply the data to the data input/output circuit 230.

The data input/output circuit 230 may be connected through data lines DLs to the page buffer circuit 220, and may apply received data DATA to the page buffer circuit 220 or may output the data DATA applied from the page buffer circuit 220 to the outside. The data input/output circuit 230 may apply an input command or address to the control logic 210 or the address decoder 250.

The control logic 210 may include a memory and a processing circuitry (not shown).

The memory may include at least one of a volatile memory, non-volatile memory, random access memory (RAM), a flash memory, a hard disk drive, and an optical disk drive.

The processing circuitry may be, but not limited to, a processor, Central Processing Unit (CPU), a controller, an arithmetic logic unit (ALU), a digital signal processor, a microcomputer, a field programmable gate array (FPGA), an Application Specific Integrated Circuit (ASIC), a System-on-Chip (SoC), a programmable logic unit, a microprocessor, or any other device capable of performing operations in a defined manner.

The processing circuitry may be configured, through a layout design or execution of computer readable instructions stored in a memory (not shown), as a special purpose computer to perform the operations of a massbit counter 212 and the sub-components thereof including a massbit count circuit 212A and a count management circuit 212B.

In an example embodiment, when massbit counting needed for a desired (or, alternatively, predetermined) memory operation is performed, the count management circuit 212B may adjust a value of a massbit counting-related parameter according to a memory operation. In an example embodiment, the count management circuit 212B may generate a verify control signal VFY_CS based on a parameter and may apply the verify control signal VFY_CS to the page buffer circuit 220. The page buffer circuit 220 may apply a signal received from the memory cell array 260 based on the verify control signal VFY_CS as a verify signal VFY_S to the massbit count circuit 212A. The massbit count circuit 212A may perform an off-cell counting operation by using the verify signal VFY_S.

In an example embodiment, the massbit counting-related parameter may be a sampling rate, and the count management circuit 212B may generate the verify control signal VFY_CS for receiving the verify signals VFY_S whose number corresponds to the sampling rate from the page buffer circuit 220. In an example embodiment, the massbit counting-related parameter may be a scaling ratio, and the count management circuit 212B may scale a size of the verify signal VFY_S received from the page buffer circuit 220 according to the scaling ratio. However, example embodiments of the inventive concepts are not limited thereto, and the count management circuit 212B may simultaneously control a sampling rate and a scaling ratio, and furthermore, may adjust an accuracy of an off-cell counting operation by adjusting values of a variety of massbit counting-related parameters.

Also, in an example embodiment, when a dummy read operation for determining a retention tendency of programmed memory cells of the memory cell array 260 is performed, the massbit counter 212 may perform massbit counting. The dummy read operation may refer to a series of operations of applying a dummy read voltage to dummy to-be-read memory cells and counting the number of off-cells. The dummy to-be-read memory cells may be memory cells, or memory cells connected to at least one word line adjacent to a word line connected to the to-be-read memory cells. In detail, when a dummy read voltage is applied to the dummy to-be-read memory cells, the massbit counter 212 may perform first off-cell counting based on a first sampling rate and a first scaling ratio. The first sampling rate and the first scaling ratio may have desired (or, alternatively, preset) values.

The count management circuit 212B may set a second sampling rate and a second scaling ratio, on which an operation for selecting a desired (or, alternatively, an optimal) read voltage to perform a next read operation is based, based on a first off-cell counting result. The massbit counter 212 may perform second off-cell counting a plurality of times based on the second sampling rate and the second scaling ratio, and the control logic 210 may select a desired (or, alternatively, an optimal) read voltage for a read operation based on second off-cell counting results. A massbit counting operation of the massbit counter 212 during a dummy read operation and a read operation (or a normal read operation) of the memory device 200 will be described below in detail with reference to FIGS. 22 through 25.

Figure 3A:
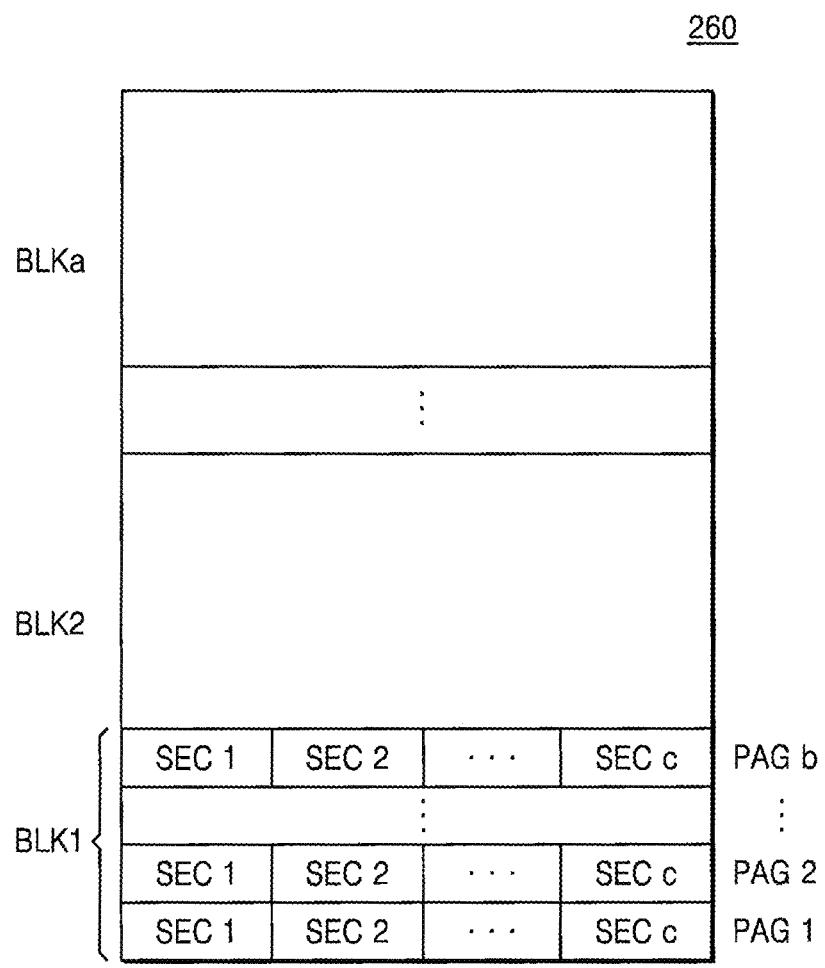
FIG. 3A is a diagram of a memory cell array of FIG. 2 according to an example embodiment.

FIG. 3A is a diagram of the memory cell array 260 of FIG. 2 according to an example embodiment. FIG. 3B is a circuit diagram of a memory block BLK1 included in the memory cell array 260 of FIG. 3A according to an example embodiment.

Referring to FIG. 3A, the memory cell array 260 of FIG. 2 may be a flash memory cell array. In this case, the memory cell array 260 may include a (a is an integer equal to or greater than 2) blocks BLK1 through BLKa. Each of the blocks BLK1 through BLKa may include b (b is an integer equal to or greater than 2) pages PAG1 through PAGb, and each of the pages PAG1 through PAGb may include c (c is an integer equal to or greater than 2) sectors SEC1 through SECc. Although only the pages PAG1 through PAGb and the sectors SEC1 through SECc of the block BLK1 are illustrated in FIG. 3 for convenience of illustrations, the other blocks BLK2 through BLKa may each have the same structure as that of the block BLK1. Each of the blocks BLK1 through BLKa of FIG. 3A may be represented as shown in FIG. 3B.

Referring to FIG. 3B, each of the blocks BLK1 through BLKa may include d (d is an integer equal to or greater than 2) cell strings CSTR to each of which eight memory cells MCEL are connected in series toward bit lines BL1 through BLd. Each cell string CSTR may include a string select transistor SST and a ground select transistor GST connected to both ends of the memory cells MCEL that are connected in series. Also, the string select transistor SST may be connected to a string select line SSL, and the ground select transistor GST may be connected to a ground select line GSL.

In a memory device having a structure of FIG. 3B, an erase operation is performed on each block, and a program operation is performed on each page PAG corresponding to word lines WL1 through WL8. In FIG. 3B, eight pages PAG for eight word lines WL1 through WL8 are provided in one block. However, the blocks BLK1 through BLKa of the memory cell array 260 of FIG. 3A according to the example embodiments may include memory cells and pages whose numbers are different from those of the memory cells MCEL and the pages PAG illustrated in FIG. 3B.

Figure 4:
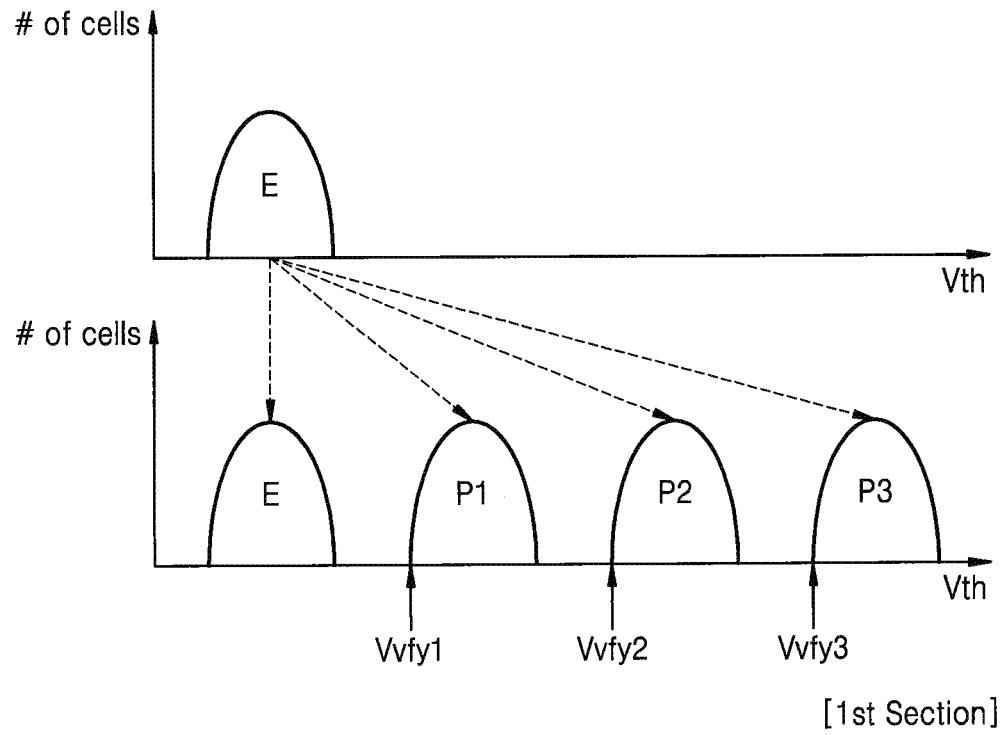
FIG. 4 is a diagram for explaining a program operation on memory cells according to an example embodiment.
Figure 4:
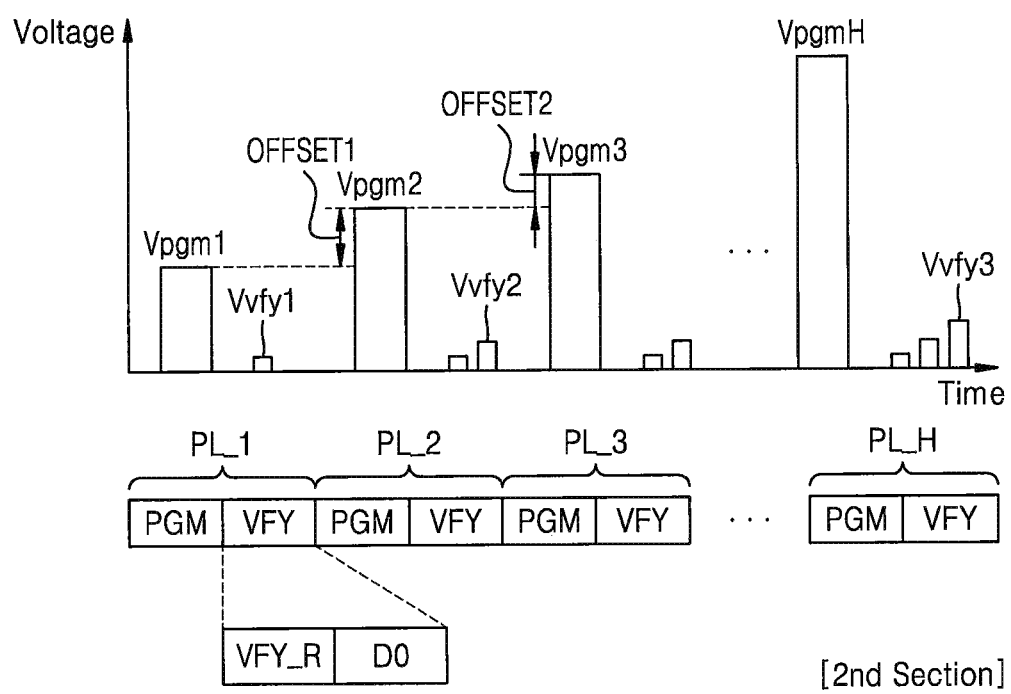

FIG. 4 is a diagram for explaining a program operation on memory cells according to an example embodiment.

For convenience of explanation, the following will be described assuming that a memory cell is a multi-level (e.g. a two-level) cell in FIG. 4 having four (i.e., 2 bits) states. The following description may also apply to a single-level cell, a triple-level cell, or a quadruple-level cell.

Referring to FIG. 4, as shown in a first section, memory cells of a memory cell array may have any one state from among an erase state E and first through third program states P1 through P3. For example, the memory cells may have the erase state E as an initial state, and after a program operation is performed on the memory cells, the memory cells may have any of the first through third program states P1 through P3 and the erase state E.

As shown in a second section, a memory device may program the memory cells based on an incremental step pulse programming (ISPP) method. The memory device may program the memory cells by performing a plurality of program loops, e.g., first through $H^{th}$ program loops PL_1 through PL_H. Each of the first through $H^{th}$ program loops PL_1 through PL_H may include a program operation PGM of applying first through $H^{th}$ program voltages Vpgm1 through VpgmH to a selected word line and a verify operation VFY of verifying program states of the memory cells. Whenever the first through $H^{th}$ program loops PL1 through PL_H are sequentially performed, a program voltage applied to the selected word line in the program operation PGM may be increased by an offset voltage OFFSET. For example, a difference between the first program voltage Vpgm1 of the first program loop PL_1 and the second program voltage Vpgm2 of the second program loop PL_2 may be a first offset voltage OFFSET1, and a difference between the second program voltage Vpgm2 of the second program loop PL_2 and the third program voltage Vpgm3 of the second program loop PL_3 may be a second offset voltage OFFSET2. The first offset voltage OFFSET1 and the second offset voltage OFFSET2 may be controlled by the memory device to be the same or different from each other.

The verify operation VFY may include a verify read operation VFY_R and a determination operation D0. The verify read operation VFY_R refers to an operation of reading the memory cells based on first through third verify voltages Vvfy1 through Vvfy3. For example, memory cells whose target program states are the first program state P1 may be read by the first verify voltage Vvfy1. A memory cell whose target program state is the first program state P1 and that is programmed to the first program state P1 may be read as an off-cell by the first verify voltage Vvfy1, and a memory cell whose target program state is the first program state P1 and that is not yet programmed to the first program state P1 may be read as an on-cell by the first verify voltage Vvfy1. The verify read operation VFY_R may be performed on memory cells whose target program states are the second program state P2 or the third program state P3 by using the second verify voltage Vvfy2 or the third verify voltage Vvfy3 as described above.

Although a massbit counter according the inventive concept counts the number of off-cells for convenience of explanation, the inventive concept is not limited thereto, and the massbit counter may count the number of on-cells and may perform a memory operation based on the number of the on-cells. Also, it will be understood that the inventive concept may be applied to both a massbit counter for counting the number of off-cells and a massbit counter for counting the number of on-cells.

After the verify read operation VFY_R is performed, the determination operation D0 may be performed. The determination operation D0 may include an operation of determining whether the program operation PGM of a program loop passes or fails. Furthermore, the determination operation D0 may include an operation of determining a tendency of a threshold voltage distribution of the memory cells due to the program operation PGM and fast cell and slow cell-related characteristics of the memory cells. The determination operation D0 may be performed by using off-cell counting results generated by the verify read operation VFY_R, as described below in detail with reference to FIG. 5.

Figure 5:
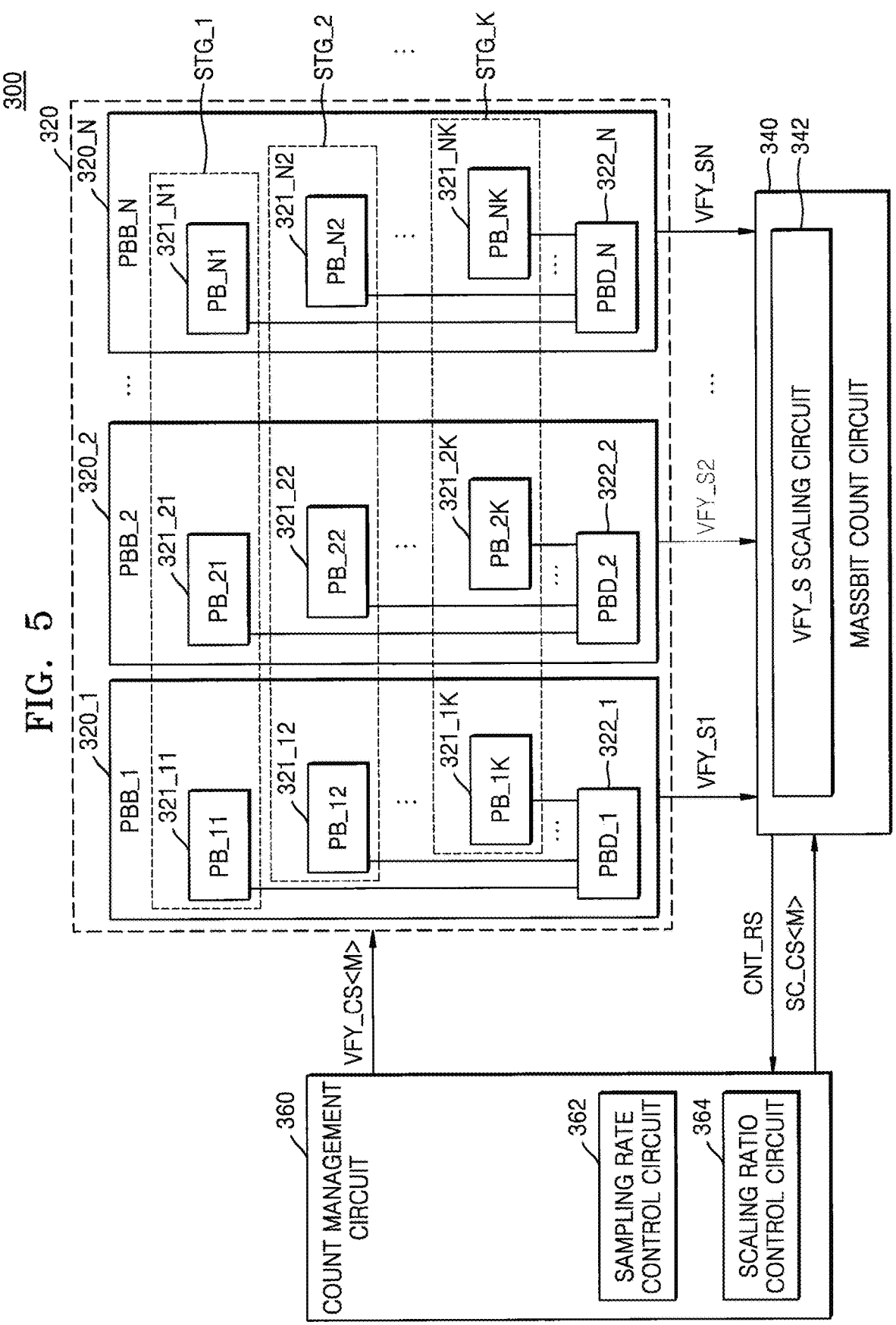
FIG. 5 is a block diagram of a memory device for explaining a massbit counting operation according to an example embodiment.

FIG. 5 is a block diagram of a memory device 300 for explaining a massbit counting operation according to an example embodiment.

Referring to FIGS. 2 and 5, as discussed above with reference to FIG. 2, the control logic 210 may include a massbit counter, and FIG. 5 illustrates a memory device 300 that also includes a massbit counter and a page buffer circuit 320, where as described above, the massbit counter may include a massbit count circuit 340 and a count management circuit 360. Other elements included in the memory device 300 have already been described with reference to FIG. 2, and thus will not be described.

The page buffer circuit 320 may include a plurality of page buffer blocks, e.g., first through $N^{th}$ page buffer blocks 320_1 through 320_N. The first page buffer block 320_1 may include first through $K^{th}$ page buffers 321_11 through 321_1K and a page buffer decoder 322_1. The first through $K^{th}$ page buffers 321_11 through 321_1K may be connected to the page buffer decoder 322_1, and the page buffer decoder 322_1 may selectively output data stored in any one page buffer from among the first through $K^{th}$ page buffers 321_11 through 321_1K. The second through $N^{th}$ page buffer blocks 320_2 through 320_K may each have the same configuration as that of the first page buffer block 320_1. Each of the page buffers 321_11 through 321_NK may be connected to the memory cell array 260 of FIG. 2 through at least one bit line. Each of the page buffers 321_11 through 321_NK may store a result of a verify read operation on each of memory cells connected to a selected word line. The page buffers 321_11 through 321_NK may be divided in units of stages. In an example embodiment, the page buffer circuit 320 may have a multi-stage structure including a plurality of stages, e.g., first through $K^{th}$ stages STG_1 through STG_K.

The count management circuit 360 may apply a verify control signal VFY_CS<M> to the page buffer circuit 320 to sequentially or non-sequentially perform a plurality of off-cell counting operations on the first through $K^{th}$ stages STG_1 through STG_K during a verify operation of one program loop (e.g., a first program loop). A determination operation of a program operation of one program loop (e.g., the first program loop) may be performed by using off-cell counting operation results.

For example, the count management circuit 360 may control the page buffer circuit 320 to apply results of a verify read operation stored in the page buffers 321_11 through 321_N1 of the first stage STG_1 as first through $N^{th}$ verify signals VFY_S1 through VFY_SN to the massbit count circuit 340. The massbit count circuit 340 may generate an off-cell counting result CNT_RS by performing a first off-cell counting operation by using the first through $N^{th}$ verify signals VFY_S1 through VFY_SN of the first stage STG_1. The massbit count circuit 340 may apply the generated off-cell counting result CNT_RS to the count management circuit 360. Next, the count management circuit 360 may control the page buffer circuit 320 to apply results of a verify read operation stored in the page buffers 321_12 through 321_N2 of the second stage STG_2 as the first through $N^{th}$ verify signals VFY_S1 through VFY_SN to the massbit count circuit 340. The massbit count circuit 340 may perform a second off-cell counting operation by using the first through $N^{th}$ verify signals VFY_S1 through VFY_SN of the second stage STG_2. In the above manner, the count management circuit 360 may control first through $K^{th}$ off-cell counting operations by iteratively applying the verify control signal VFY_CS<M> to the page buffer circuit 320 a plurality of times.

In an example embodiment, the count management circuit 360 may include a sampling rate control circuit 362. The sampling rate control circuit 362 may adjust a sampling rate. The sampling rate may refer to a ratio of results of a verify read operation applied as verify signals to the massbit count circuit 340 with respect to results of the verify read operation stored in page buffers of a stage. In detail, when a first off-cell counting operation is performed, the sampling rate control circuit 362 may apply the verify control signal VFY_CS<M> generated based on a sampling rate to the page buffer circuit 320, and the page buffer circuit 320 may output, to the massbit count circuit 340, verify read results stored in some page buffers according to the sampling rate from among the page buffers 321_11 through 321_N1 of the first stage in response to the verify control signal VFY_CS<M>. For example, when a sampling rate is 1:2, the massbit count circuit 340 may receive only verify signals output from half the page buffers 321_11 through 321_N1 of the first stage STG_1, and may perform the first off-cell counting operation. The massbit count circuit 340 may receive the first verify signal VFY_S1 from the first page buffer block 320_1, and may not receive the second verify signal VFY_S2 marked by a dash line from the second page buffer block 320_2. Page buffers selected according to a sampling rate from among page buffers of a stage may be preset, or page buffers selected according to a memory operation or a memory operation environment may be changed.

The sampling rate control circuit 362 may adjust a sampling rate according to a memory operation. In an example embodiment, when a memory operation that requires a precise massbit counting operation is performed, the sampling rate control circuit 362 may change a sampling rate to a value higher than a sampling rate of a memory operation that does not require a precise massbit counting operation (i.e., a memory operation not affected by whether a rough massbit counting operation is performed). In an example embodiment, the sampling rate control circuit 362 may adjust a sampling rate during a verify operation of a program loop performed before a reference loop to be different from a sampling rate during a verify operation of a program loop performed after the reference program loop. In an example embodiment, when the memory device 300 performs a program operation by using a shadow program method, the sampling rate control circuit 362 may adjust a sampling rate during a verify operation of a program loop for programming a least significant bit to be different from a sampling rate during a verify operation of a program loop for programming a most significant bit. In an example embodiment, the sampling rate control circuit 362 may adjust a sampling rate during a memory operation performed by the memory device 300 based on a read defence code to determine a desired (or, alternatively, an optimal) read voltage considering a phenomenon where charges trapped in a memory cell escape a desired (or, alternatively, a predetermined) time after a program operation to be different from a sampling rate during a verify operation of a program loop for a general program operation. Furthermore, the sampling rate control circuit 362 may adjust a sampling rate according to an operation environment of the memory device 300. The operation environment of the memory device 300 may include at least one from among a program/erase (P/E) cycle of the memory device 300, an internal temperature, and process characteristics.

When a sampling rate is increased to a desired (or, alternatively, a predetermined) level or more to increase an accuracy in performing an off-cell counting operation, the off-cell counting result CNT_RS may be equal to or greater than a reference value or may have an overflow value according to a memory operation environment or characteristics of memory cells. In this case, an accurate counting operation may not be performed. Accordingly, in order to ensure that the off-cell counting result CNT_RS is less than the reference value and a sampling rate is determined to have an appropriate value higher than that of a general sampling rate, the sampling rate control circuit 362 may operate as follows.

The sampling rate control circuit 362 may determine an appropriate sampling rate by adjusting a sampling rate based on the off-cell counting result CNT_RS during a plurality of off-cell counting operations included in a verify operation of one program loop. For example, the sampling rate control circuit 362 may adjust a sampling rate, on which a second off-cell counting operation for the second stage STG_2 is based, based on the first off-cell counting result CNT_RS of the first stage STG_1. In an example embodiment, the sampling rate control circuit 362 may change a sampling rate when the first off-cell counting result CNT_RS is equal to or greater than the reference value, and may maintain the sampling rate when the first off-cell counting result CNT_RS is less than the reference value.

In some example embodiment, the count management circuit 360 may further include a scaling ratio control circuit 364, and the massbit count circuit 340 may include a scaling circuit 342.

The scaling ratio control circuit 364 may adjust a scaling ratio. The scaling ratio may refer to a ratio between a size of a verify signal output from the page buffer circuit 320 and a size of a verify signal scaled by the scaling circuit 342. In an example embodiment, when a memory operation that requires a precise massbit counting operation is performed, the scaling ratio control circuit 364 may change a scaling ratio to a value higher than a scaling ratio of a memory operation that does not require a precise massbit counting operation (i.e., a memory operation not affected by whether a rough massbit counting operation is performed). In detail, when a first off-cell counting operation is performed, the scaling ratio control circuit 364 may apply a scaling control signal SC_CS<M> generated based on a sampling rate to the scaling circuit 342, and the scaling circuit 342 may scale the first through $N^{th}$ verify signals VFY_S1 through VFY_SN received from the page buffer circuit 320 in response to the scaling control signal SC_CS<M>. For example, when a scaling ratio is 1:2, the scaling circuit 342 may scale a size of each of the first through $N^{th}$ verify signals VFY_S1 through VFY_SN to half, and may generate the off-cell counting result CNT_RS by using the scaled verify signals.

The scaling ratio control circuit 364 may adjust a scaling ratio according to a memory operation. Also, the scaling ratio control circuit 364 may determine an appropriate scaling ratio by adjusting a scaling ratio based on the off-cell counting result CNT_RS during a plurality of off-cell counting operations performed during a verify operation of one program loop. The scaling ratio control circuit 364 may apply the scaling control signal SC_CS<M> generated based on the scaling ratio to the scaling circuit 342. A method by which the scaling ratio control circuit 364 adjusts a scaling ratio is similar to a method by which the sampling rate control circuit 362 adjusts a sampling rate, and thus a detailed explanation thereof will not be given.

In some example embodiments, the count management circuit 360 of FIG. 5 may simultaneously adjust a sampling rate and a scaling ratio, and may adjust a sampling rate while fixing a scaling ratio or may adjust a scaling ratio while fixing a sampling rate.

Figure 6:
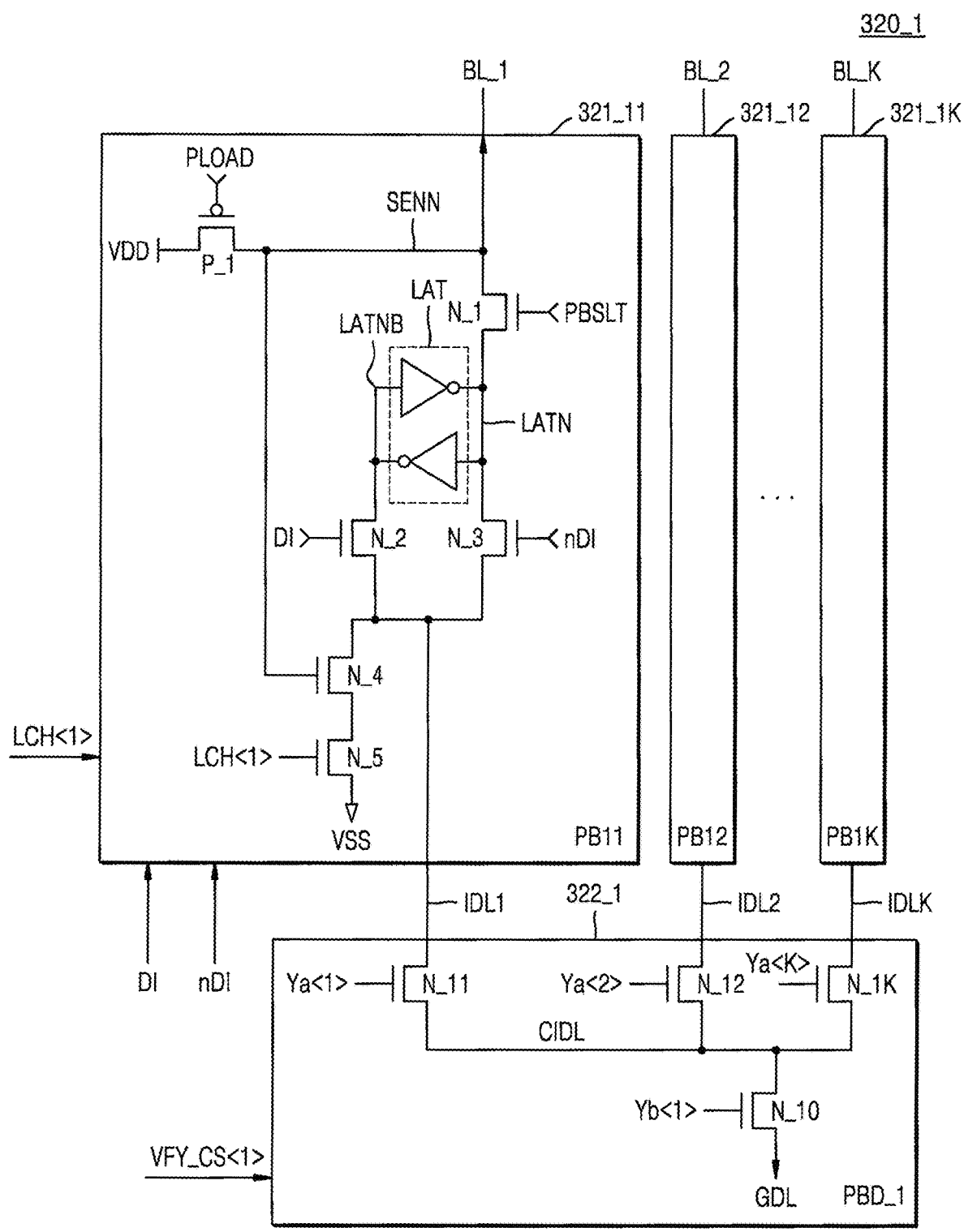
FIG. 6 is a circuit diagram for explaining a configuration of a first page buffer block of FIG. 5 in detail.

FIG. 6 is a circuit diagram for explaining a configuration of the first page buffer block 320_1 of FIG. 5 in detail.

Referring to FIG. 6, the first page buffer block 320_1 may include the first through $K^{th}$ page buffers 321_11 through 321_1K and the page buffer decoder 322_1. The first page buffer 321_11 may include a plurality of transistors P_1 through N_5 and a latch LAT that stores a verify read result of a memory cell connected to a first bit line BL_1. Each of the plurality of transistors P_1 through N_5 may be controlled by a load control signal PLOAD, a page buffer select signal PBSLT, a data input select signal DI, a data input select inversion signal nDI, and a latch signal LCH<1>. The latch LAT may be connected to a latch node LATN and a latch inversion node LATNB. When a memory cell connected to the first bit line BL_1 during a verify operation is an on-cell, the latch node LATN may have a low-level value, and when a memory cell connected to the first bit line BL_1 during a verify operation is an off-cell, the latch node LATN may have a high-level value. The following will be described assuming that when a memory cell is an off-cell, a verify signal has a high level.

A configuration of the first page buffer BL_1 may apply to other page buffers BL_2 through BL_K. The page buffers BL_1 through BL_K may be connected to the page buffer decoder 322_1 through internal data lines IDL1 through IDLK.

The page buffer decoder 322_1 may include a plurality of first select transistors N_11 through N_1K connected between the page buffers BL_1 through BL_K and a common internal data line CIDL and a second select transistor N_10 connected between the common internal data line CIDL and a global data line GDL. The first select transistors N_11 through N_1K and the second select transistor N_10 may be controlled by a verify control signal VFY_CS<1> to be turned on or off. In an example embodiment, the verify control signal VFY_CS<1> may include first control signals Ya<1> through Ya<K> to control switching the first select transistors N_11 through N_1K on/off and a second control signal Yb<1> to control switching the second select transistor N_10 on/off.

Off-cell counting operations may be sequentially or non-sequentially performed according to stages by using the first control signals Ya<1> through Ya<K>, and a verify read result selectively stored in the latch LAT according to a sampling rate by using the second control signal Yb<1> may be output as a verify signal to a massbit count circuit. The configuration of the first page buffer block 320_1 of FIG. 6 may apply to the second through N$^{th}$ page buffer blocks 320_2 through 320_N of FIG. 5. However, example embodiments of the inventive concepts are not limited to the example embodiments of FIG. 6, and various modifications may be made within the scope of example embodiments of the inventive concepts.

Figure 7A:
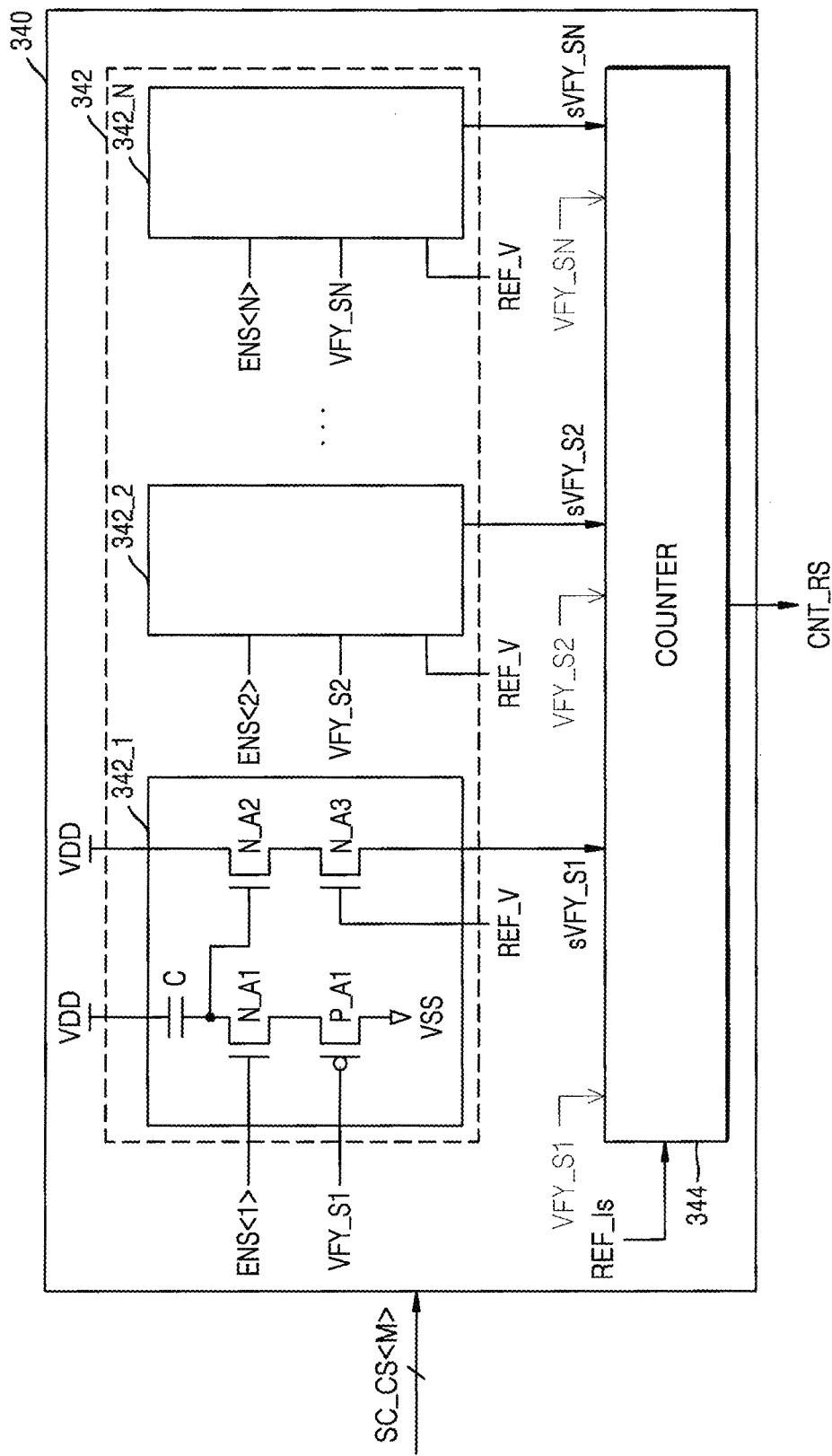
FIG. 7A is a circuit diagram for explaining a configuration of a massbit count circuit of FIG. 5 in detail.
Figure 7B:
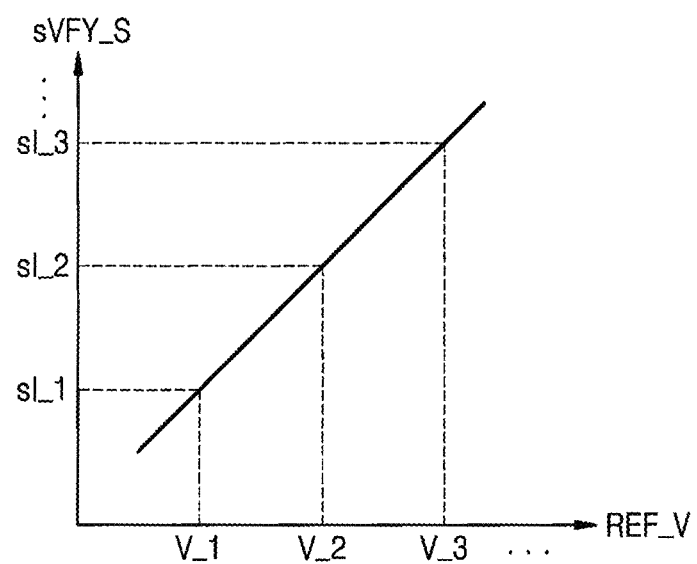
FIG. 7B is a graph for explaining a relationship between a variable reference voltage and a scaled verify signal.

FIG. 7A is a circuit diagram for explaining a configuration of the massbit count circuit 340 of FIG. 5 in detail. FIG. 7B is a graph for explaining a relationship between a variable reference voltage REF_V and a scaled verify signal sVFY_S.

Referring to FIG. 7A, the massbit count circuit 340 may include the scaling circuit 342 and a counter 344. The scaling circuit 342 may include first through N$^{th}$ scaling units 342_1 through 342_N.

In an example embodiment, the first scaling unit 342_1 may include a plurality of transistors N_A1 through N_A3, P_A1 and a capacitor C. When the first scaling unit 342_1 is in a disable state, the first scaling unit 342_1 may not scale the first verify signal VFY_S1. The counter 344 may directly receive the first verify signal VFY_S1 marked by a dash line. In response to an enable signal ENS<1> received by the transistor N_A2, the first scaling unit 342_1 may be enabled. The enable signal ENS<1> may have a high level during a verify operation of a program loop. A transistor P_A1 may receive the first verify signal VFY_S1, and may be connected to the ground VSS based on a level of the first verify signal VFY_S1. For example, when the first verify signal VFY_S1 has a low level, the transistor P_A1 of the first scaling unit 342_1 may be connected to the ground VSS, a voltage of one end of the capacitor C may be changed to a ground voltage, the transistor N_A2 may be turned off, and a scaled first verify signal sVFY_S1 having a low level may be output. Also, when the first verify signal VFY_S1 has a high level, the transistor P_A1 of the first scaling unit 342_1 may not be connected to the ground VSS, a voltage of one end of the capacitor C may be maintained, the transistor N_A2 may be turned on, and the first scaling unit 342_1 may output the scaled first verify signal sVFY_S1 based on the variable reference voltage REF_V. A configuration of the first scaling unit 342_1 may apply to configurations of the second through N$^{th}$ scaling units 342_1 through 342_N.

The scaling control signal SC_CS<M> may include enable signals ENS<1> through ENS<N> and the variable reference voltage REF_V. Although the count management circuit 360 applies the scaling control signal SC_CS<M> to the massbit count circuit 340 in FIG. 5 for convenience of explanation, the count management circuit 360 may control the voltage generator 240 of FIG. 2 to apply the variable reference voltage REF_V to the scaling circuit 342.

Further referring to FIGS. 5 and 7B, the scaling ratio control circuit 354 may adjust a scaling ratio of the verify signal VFY_S by adjusting a size of the variable reference voltage REF_V. In an example embodiment, a size of the variable reference voltage REF_V and a size of the scaled verify signal sVFY_S may be proportional, and the size of the scaled verify signal sVFY_S may vary according to the size of the variable reference voltage REF_V. The scaling ratio control circuit 364 may generate the scaling control signal SC_CS<M> by referring to scaling reference information including a relationship between the variable reference voltage REF_V and the scaled verify signal sVFY_S as shown in FIG. 7B. For example, it may be found from the scaling reference information that the scaled verify signal sVFY_S corresponding to first current sI_1 is generated at a first voltage V_1, the scaled verify signal sVFY_S corresponding to second current sI_2 is generated at a second voltage V_2, and the scaled verify voltage sVFY_S corresponding to third current sI_3 is generated at a third voltage V_3. However, example embodiments of the inventive concepts are not limited thereto, and various modifications may be made within the scope of example embodiments of the inventive concepts.

Figure 8A:
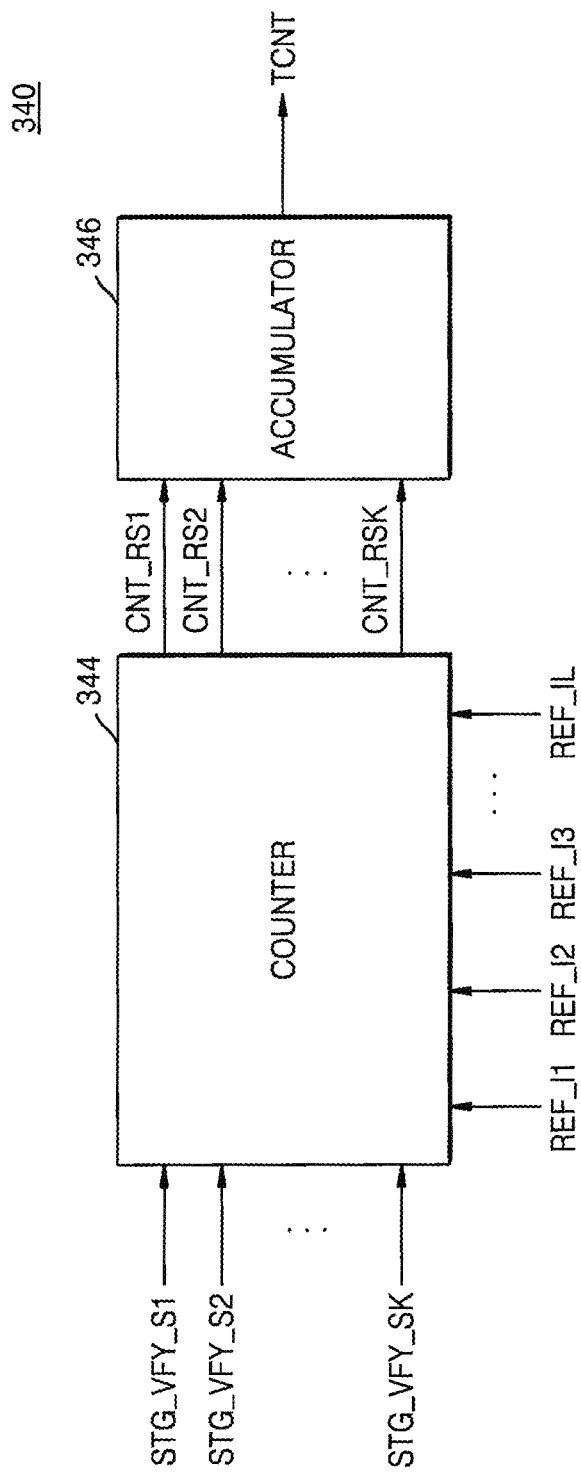
FIG. 8A is a block diagram for explaining the massbit count circuit for generating a total counting result value.
Figure 8B:
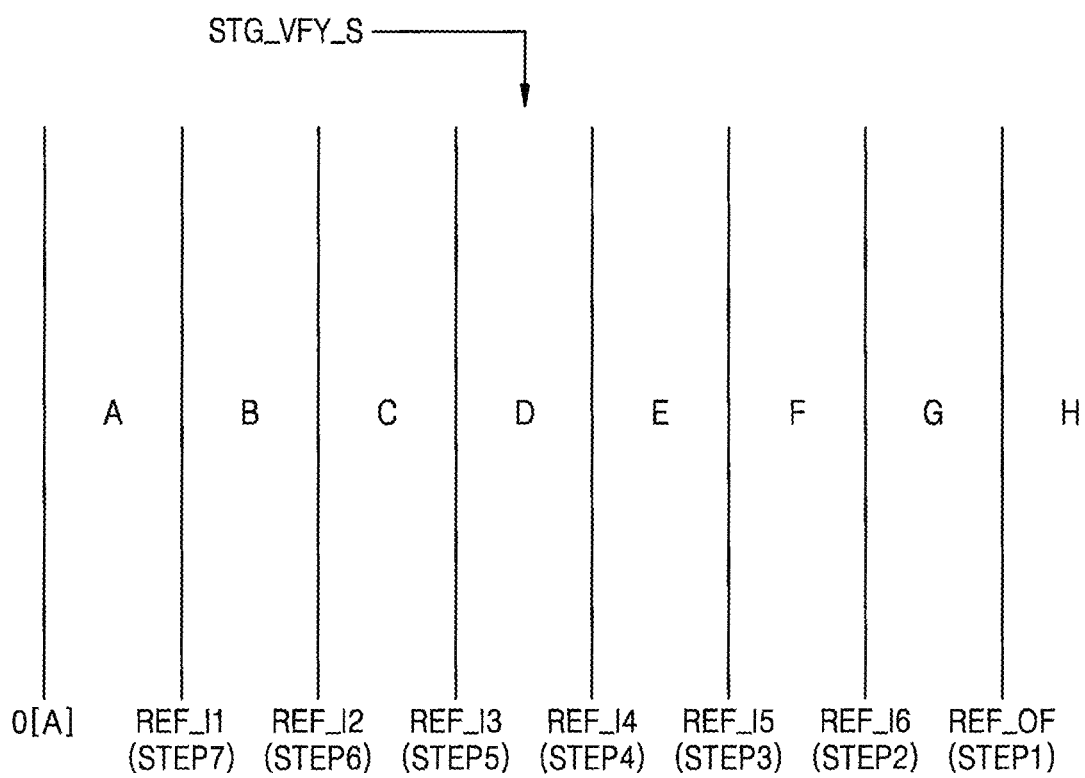

FIG. 8A is a block diagram for explaining the massbit count circuit 340 for generating a total counting result value TCNT. FIGS. 8B through 8D are diagrams for explaining a method of generating the off-cell counting result CNT_RS by using a sum STG_VFY_S of stage verify signals received from a stage.

Referring to FIGS. 5 and 8A, the massbit count circuit 340 may further include the counter 344 and an accumulator 346. The counter 344 may receive a sum STG_VFY_S1 of first stage verify signals corresponding to the first stage STG_1 through a sum STG_VFY_SK of K$^{th}$ stage verify signals corresponding to the K$^{th}$ stage STG_K from the page buffer circuit 320 during a verify operation of a program loop, may compare the sums with desired (or, alternatively, predetermined) reference currents, e.g., first through L$^{th}$ reference currents REF_I1 through REF_IL, and may generate first through K$^{th}$ off-cell counting results CNT_RS1 through CNT_RSK.

An operation of the counter 344 will now be described with further reference to FIG. 8B.

Referring to FIG. 8B, the counter 344 may generate an off-cell counting result by comparing the sum STG_VFY_S of stage verify signals with the first through sixth reference currents REF_I1 through REF_I6 and an overflow reference current REF_OF. In an example embodiment, the counter 344 may compare the sum STG_VFY_S of stage verify signals with the overflow reference current REF_OF and then sequentially with the sixth reference current REF_I6 through the first reference current REF_I1, may determine which section the sum STG_VFY_S of stage verify signals belongs to from among sections A through H, and may generate an off-cell counting result corresponding to the determined section. The overflow reference current REF_OF may be used to determine whether to change a sampling rate or a scaling ratio on which a next off-cell counting operation is based, as described below in detail.

Referring to FIG. 8C, when a sampling rate has a reference value 1:2*Ra, the counter 344 may generate an off-cell counting result by referring to first table information TB_1 including an off-cell counting result corresponding to each of the sections A through G. For example, when the sum STG_VFY_S of stage verify signals belongs to the section G, the counter 344 may generate an off-cell counting result having an overflow value OF. In this manner, the counter 344 may determine which section the sum STG_VFY_S of stage verify signals belongs to from among the sections A through F, and may generate an off-cell counting result corresponding to any one from among values NUM_Aa through NUM_Fa according to a determination result.

Referring to FIG. 8D, when a scaling ratio has a reference value 1:2*Rb, the counter 344 may generate an off-cell counting result by referring to second table information TB_2 including an off-cell counting result corresponding to each of the sections A through G. For example, when the sum STG_VFY_S of stage verify signals belongs to the section G, the counter 344 may generate an off-cell counting result having the overflow value OF. In this manner, the counter 344 may determine which section the sum STG_VFY_S of stage verify signals belongs to from among the sections A through F, and may generate an off-cell counting result corresponding to any one from among values NUM_Ab and NUM_Fb according to a determination result.

Referring back to FIG. 8A, the accumulator 346 may generate the total counting result value TCNT by accumulating the first through $K^{th}$ off-cell counting results CNT_RS1 through CNT_RSK that are generated in the above method. In an example embodiment, the accumulator 346 may generate the total counting result value TCNT in consideration of off-cell counting results having the overflow value OF from among the first through $K^{th}$ off-cell counting results CNT_RS1 through CNT_RSK, as described below in detail with reference to FIG. 14.

FIG. 9A is a diagram for explaining a method of generating an off-cell counting result when a sampling rate is changed. FIG. 9B is a diagram for explaining a method of generating an off-cell counting result when a scaling ratio is changed.

Referring to FIGS. 8A and 9A, when a sampling rate is changed to a first value 1:Ra that is twice the reference value 1:2*Ra, the counter 344 may generate an off-cell counting result by referring to third table information TB_3 including an off-cell counting result corresponding to each of the sections A through G. For example, when the sum STG_VFY_S of stage verify signals belongs to the section G, the counter 344 may generate an off-cell counting result having the overflow value OF. In this manner, the counter 344 may determine which section the sum STG_VFY_S of stage verify signals belongs to from among the sections A through F, and may generate an off-cell counting result corresponding to any one from among values NUM_Aa/2 through NUM_Fa/2 according to a determination result.

Also, when a sampling rate is changed to a second value 1:4*Ra that is half the reference value 1:2*Ra, the counter 344 may generate an off-cell counting result by referring to the third table information TB_3 including an off-cell counting result corresponding to each of the sections A through G. For example, when the sum STG_VFY_S of stage verify signals belongs to the section G, the counter 344 may generate an off-cell counting result having the overflow value OF. Also, the counter 344 may determine which section the sum STG_VFY_S of stage verify signals belongs to from among the sections A through F, and may generate an off-cell counting result corresponding to any one from among values 2*NUM_Aa through 2*NUM_Fa according to a determination result.

However, example embodiments of the inventive concepts are not limited thereto, and the counter 344 may generate an off-cell counting result in consideration of a ratio between the reference value 1:2*Ra and the first value 1:Ra or a ratio between the reference value 1:2*Ra and the second value 1:4Ra by referring to the first table information TB_1 of FIG. 8C.

Further referring to FIG. 9B, when a scaling ratio is changed to a third value 1:Rb that is twice the reference value 1:2*Rb or to a fourth value 1:4*Rb, the counter 344 may generate an off-cell counting result by referring to the fourth table information TB_4 including an off-cell counting result corresponding to each of the sections A through G.

As shown in FIGS. 9A and 9B, when a sampling rate or a scaling ratio is changed to a higher value, a unit interval between off-cell counting results may be further reduced, and thus a precise off-cell counting operation may be performed. Also, when a sampling rate or a scaling ratio is changed to a lower value, a unit interval between off-cell counting results may be further increased, and thus a rough off-cell counting operation may be performed.

Figure 10A:
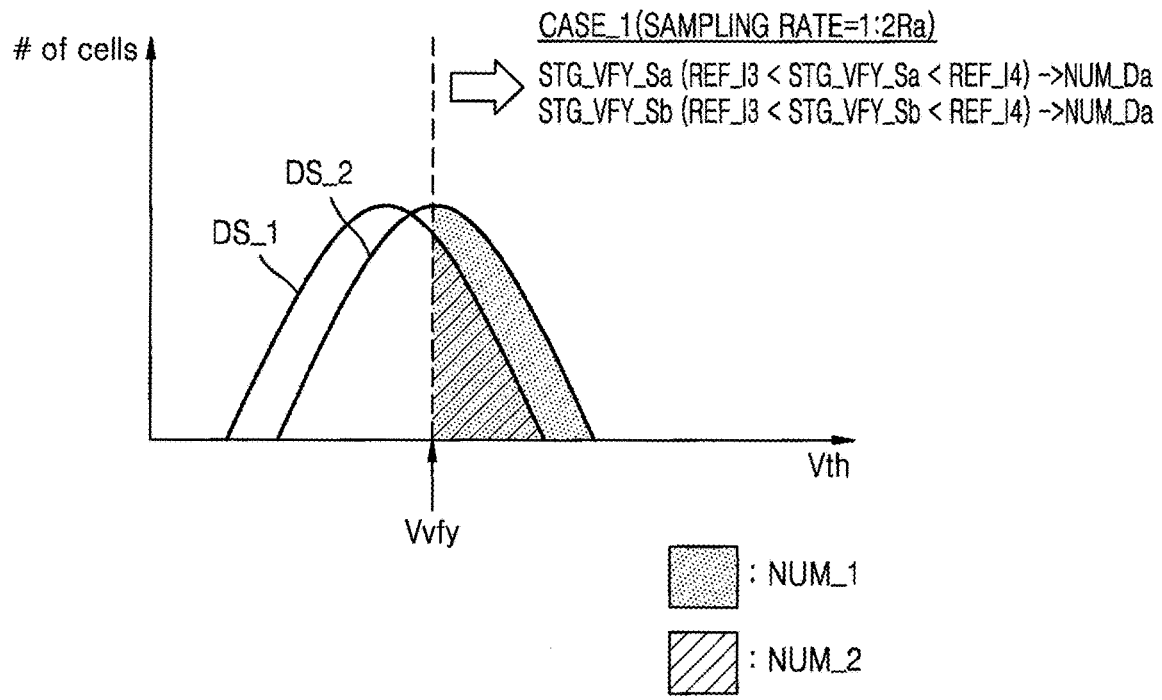
FIGS. 10A and 10B are diagrams for explaining a case where a precise massbit counting operation is required.
Figure 10B:
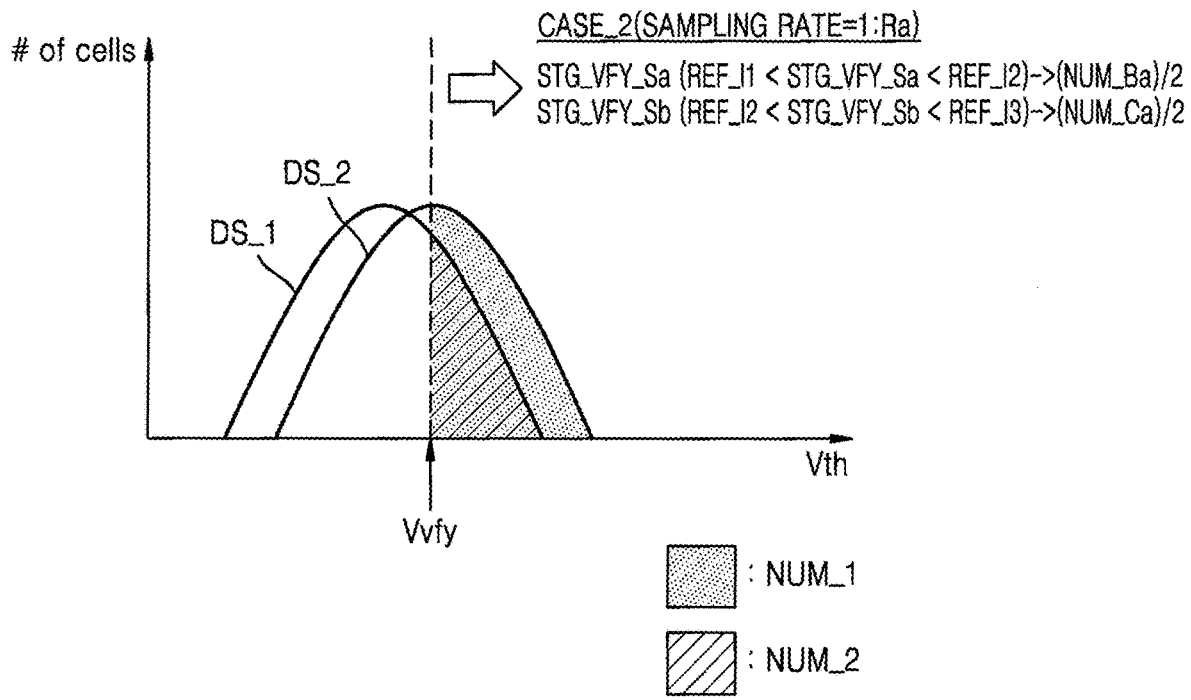

FIGS. 10A and 10B are diagrams for explaining a case where a precise massbit counting operation is required. FIGS. 10A and 10B will be described based on the description of FIGS. 8B and 8C.

Referring to FIG. 10A, when a memory device performs a program operation of one program loop on memory cells, the memory cells may form a first threshold voltage distribution DS_1 or a second threshold voltage distribution DS_2 according to characteristics. Next, when a verify operation is performed by using a desired (or, alternatively, a predetermined) verify voltage Vvfy, and a value of a sampling rate is 1:2Ra, a sum STG_VFY_Sa of stage verify signals corresponding to the first threshold voltage distribution DS_1 may belong to the section D between the third reference current REF_I3 and the fourth reference current REF_I4. Accordingly, the counter 344 may generate an off-cell counting result having the value NUM_Da. A sum STG_VFY_Sb of stage verify signals corresponding to the second threshold voltage distribution DS_2 may also belong to the section D between the third reference current REF_I3 and the fourth reference current REF_I4. Accordingly, the counter 344 may generate an off-cell counting result having the value NUM_Da.

As such, although the actual number of off-cells having a threshold voltage equal to or greater than the verify voltage Vvfy in the first threshold voltage distribution DS_1 is 'NUM_1' and the actual number of off-cells having a threshold voltage equal to or greater than the verify voltage Vvfy in the second threshold voltage distribution DS_2 is 'NUM_2' that is greater than 'NUM_1', there is no difference between off-cell counting results generated by the counter. Accordingly, the above massbit counting operation should not be used for a specific memory operation that has to accurately determine and consider characteristics of memory cells including retention characteristics of the memory cells or threshold voltage distribution characteristics according to a program operation.

Further referring to FIG. 10B, a sampling rate is 1:Ra, which may be obtained by changing a sampling rate of FIG. 10A to a higher value for a more precise massbit counting operation. The sum STG_VFY_Sa of stage verify signals corresponding to the first threshold voltage distribution DS_1 may belong to the section B between the first reference current REF_I1 and the second reference current REF_I2. Accordingly, the counter may generate an off-cell counting result having the value 'NUM_Ba/2'. The sum STG_VFY_Sb of stage verify signals corresponding to the second threshold voltage distribution DS_2 may belong to the section C between the second reference current REF_I2 and the third reference current REF_I3. Accordingly, the counter may generate an off-cell counting result having the value 'NUM_Ca/2'. As a result, a difference between the actual number of off-cells corresponding to the first threshold voltage distribution DS_1 and the actual number of off-cells corresponding to the second threshold voltage distribution DS_2 may be determined by using off-cell counting results generated by the counter. As such, a precise massbit counting operation that may relatively accurately reflect the actual number of off-cells may be performed by changing a sampling rate to a higher value.

Figure 11:
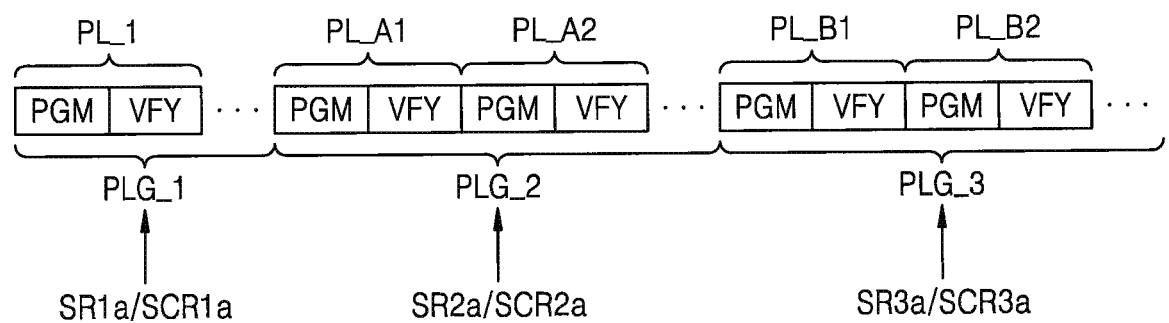
FIG. 11 is a diagram for explaining a method of adjusting a sampling rate and a scaling ratio for each program loop group according to an example embodiment.

FIG. 11 is a diagram for explaining a method of adjusting a sampling rate SR and a scaling ratio SCR for each program loop group according to an example embodiment.

Referring to FIG. 11, a memory device may perform a plurality of program loops and may differently change at least one of the sampling rate SR and the scaling ratio SCR according to each program loop group. For example, a verify operation of a program loop PL_1 included in a first program loop group PLG_1 may be performed based on a first sampling rate SR1a or a first scaling ratio SCR1a. A verify operation of each of program loops PL_A1 and PL_A2 included in a second program loop group PLG_2 may be performed based on a second sampling rate SR2a or a second scaling ratio SCR2a. Also, a verify operation of each of program loops PL_B1 and PL_B2 included in a third program loop group PLG_3 may be performed based on a third sampling rate SR3a or a third scaling ratio SCR3a.

In an example embodiment, at least one reference program loop that is a basis for differently changing at least one of the sampling rate SR and the scaling ratio SCR may be set (or, alternatively, pre-set.) For example, a sampling rate or a scaling ratio of a verify operation of a program loop performed before the reference program loop may be adjusted to be different from a sampling rate or a scaling ratio of a verify operation of a program loop performed after the reference program loop. In an example embodiment, in a memory device for performing program loops based on a one shot program method, since a verify result of early program loops may be more important than a verify result of late program loops in forming a desired threshold voltage distribution of memory cells, an earlier program loop may be adjusted to have a higher sampling rate or scaling ratio.

Figure 12:
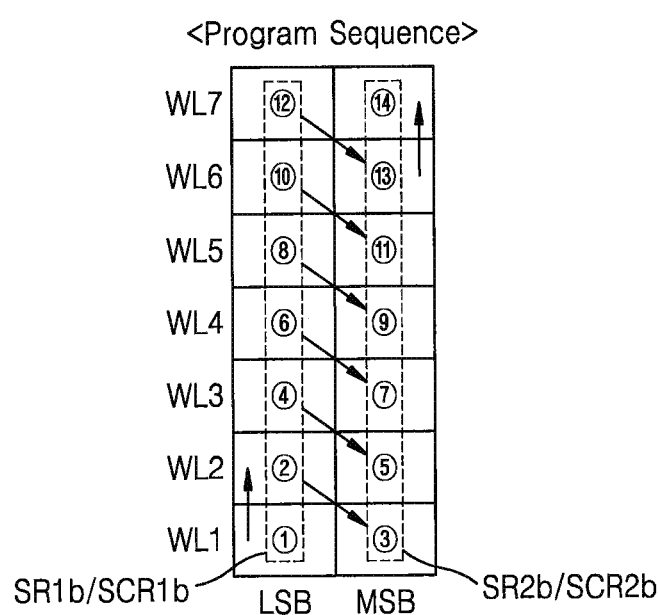
FIG. 12 is a diagram for explaining a method of adjusting a sampling rate and a scaling ratio when a program loop is performed by using a shadow program method according to an example embodiment.

FIG. 12 is a diagram for explaining a method of adjusting the sampling rate SR and the scaling ratio SCR when a program loop is performed by using a shadow program method according to an example embodiment.

Referring to FIG. 12, a program operation may be performed according to a desired (or, alternatively, predetermined) program sequence by using a shadow program method on memory cells connected to word lines WL1 through WL7. In this case, a first sampling rate SR1b or a first scaling ratio SCR1b on which a verify operation of a program loop for programming a least significant bit LSB is based may be adjusted to be different from a second sampling rate SR2b or a second scaling ratio SCR2b on which a verify operation of a program loop for programming a most significant bit MSB is based. In an example embodiment, since a program loop for programming the most significant bit MSB has to form a threshold voltage distribution of memory cells more precisely than a program loop for programming the least significant bit LSB, the second sampling rate SR2b or the second scaling ratio SCR2b may be adjusted to be higher than the first sampling rate SR1b or the first scaling ratio SCR1b.

Figure 13A:
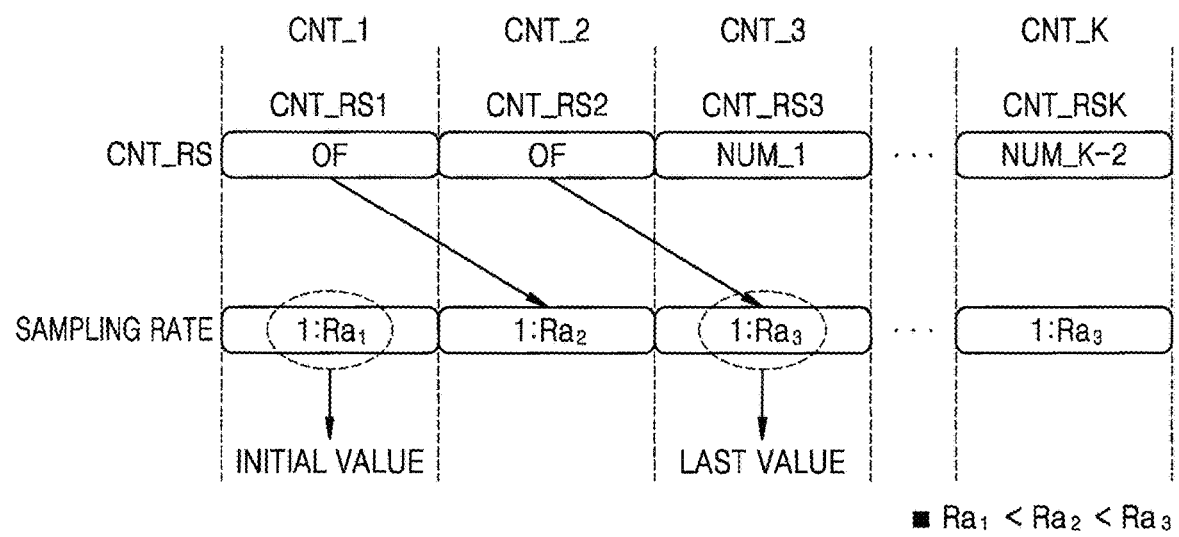
FIGS. 13A and 13B are diagrams for explaining a method of determining an appropriate sampling rate by adjusting a sampling rate or a scaling ratio based on an off-cell counting result generated by performing an off-cell counting operation included in a verify operation of one program loop.
Figure 13B:
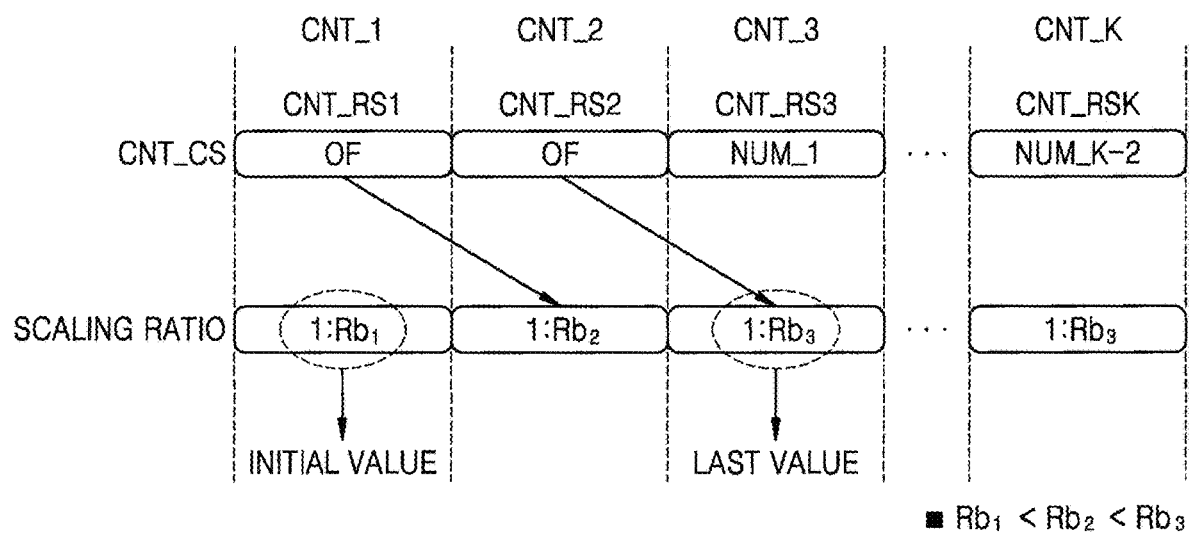

FIGS. 13A and 13B are diagrams for explaining a method of determining an appropriate sampling rate or scaling ratio by adjusting a sampling rate or a scaling ratio based on an off-cell counting result generated by performing an off-cell counting operation included in a verify operation of one program loop.

Referring to FIG. 13A, when a verify operation of one program loop, for example, a first program loop, is performed, a memory device may perform a plurality of off-cell counting operations, e.g., first through $K^{th}$ off-cell counting operations CNT_1 through CNT_K. When the off-cell counting result CNT_RS during each off-cell counting operation is equal to or greater than a reference value (e.g., when the off-cell counting result CNT_RS has the overflow value OF), the memory device may change a sampling rate on which a next off-cell counting operation is based.

In an example embodiment, the memory device may perform the first off-cell counting operation CNT_1 by setting an initial value of a sampling rate to '1:$Ra_1$', and may generate the first off-cell counting result CNT_RS1 having the overflow value OF. The memory device may change the sampling rate to '1:$Ra_2$' that is lower than '1:$Ra_1$' based on the first off-cell counting result CNT_RS1, may perform the second off-cell counting operation CNT_2, and may generate the second off-cell counting result CNT_RS2 having the overflow value OF. Next, the memory device may change the sampling rate to '1:$Ra_3$' that is lower than '1:$Ra_2$' based on the second off-cell counting result CNT_RS2, may perform the third off-cell counting operation CNT_3, and may generate the third off-cell counting result CNT_RS3 having the value 'NUM_1'. The memory device may perform the fourth through $K^{th}$ off-cell counting operations CNT_4 through CNT_K by fixing the sampling rate to '1:$Ra_3$', and a value of the fixed sampling rate may be referred to as a last value.

In an example embodiment, the memory device may differently adjust a sampling rate on which a massbit counting operation is based according to a memory operation. In this case, the memory device may change an initial value or a last value of a sampling rate to a higher value when a precise massbit counting operation is required. For example, an initial value of a sampling rate set for a first off-cell counting operation included in a verify operation of a first program loop may be different from an initial value of a sampling rate set for a first off-cell counting operation included in a verify operation of a second program loop. In another example embodiment, a last value of a sampling rate fixed for an off-cell counting operation included in a verify operation of a first program loop may be different from a last value of a sampling rate fixed for an off-cell counting operation included in a verify operation of a second program loop.

Referring to FIG. 13B, when a verify operation of one program loop, for example, a first program loop, is performed, the memory device may perform the first through $K^{th}$ off-cell counting operations CNT_1 through CNT_K. When the off-cell counting result CNT_RS during each off-cell counting operation is equal to or greater than a reference value (or when the off-cell counting result CNT_RS has the overflow value OF), the memory device may change a scaling ratio on which a next off-cell counting operation is based. An operation of changing a scaling ratio is similar to an operation of changing a sampling rate described with reference to FIG. 13A, and thus a detailed explanation thereof will not be given.

Figure 14:
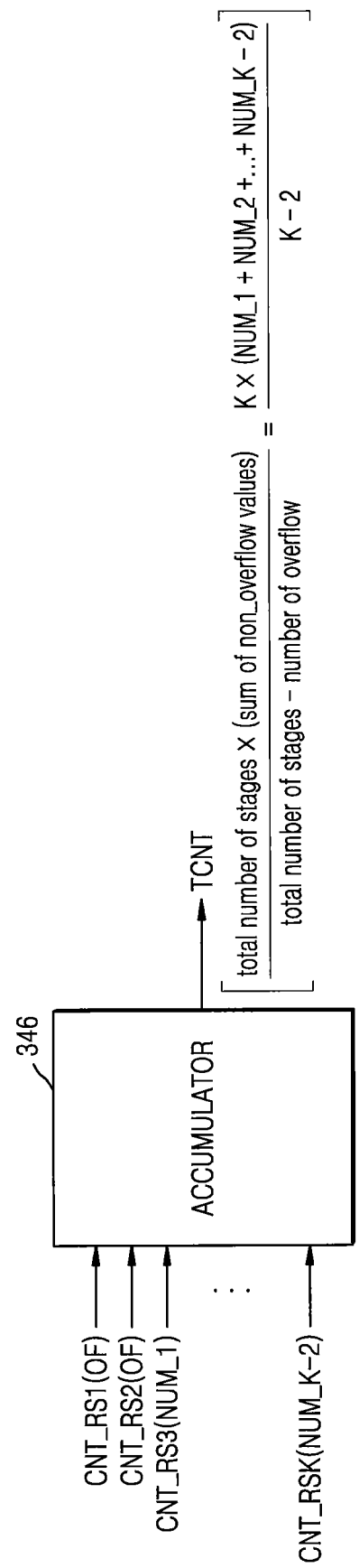
FIG. 14 is a block diagram for explaining a method of generating a total counting result value of an accumulator according to an example embodiment.

FIG. 14 is a block diagram for explaining a method of generating the total counting result value TCNT of the accumulator 346 according to an example embodiment. FIG. 14 will be described based on the description of FIG. 13A.

Referring to FIG. 14, the accumulator 346 may receive the first through $K^{th}$ off-cell counting results CNT_RS1 through CNT_RSK. In an example embodiment, the accumulator 346 may accumulate remaining results by excluding results equal to or greater than a reference value (e.g., off-cell counting results each having the overflow value OF) from among the off-cell counting results CNT_RS1 through CNT_RSK. Next, the accumulator 346 may generate the total counting result value TCNT from an accumulated value by reflecting the number of off-cell counting operations corresponding to the excluded results. For example, the accumulator 346 may accumulate the third through $K^{th}$ off-cell counting results CNT_RS3 through CNT_RSK by excluding the first and second off-cell counting results CNT_RS1 and CNT_RS2 each having the overflow value OF, and may divide a value, which is obtained by multiplying the total number K of off-cell counting operations by an accumulated value (NUM1+ . . . + NUM_K2) by a value obtained by subtracting 2, which is the number of off cell counting operations corresponding to the excluded results, from the total number K of off-cell counting operations. The accumulator 346 may generate the accurate total counting result value TCNT by excluding off-cell counting results each having the overflow value OF.

Figure 15:
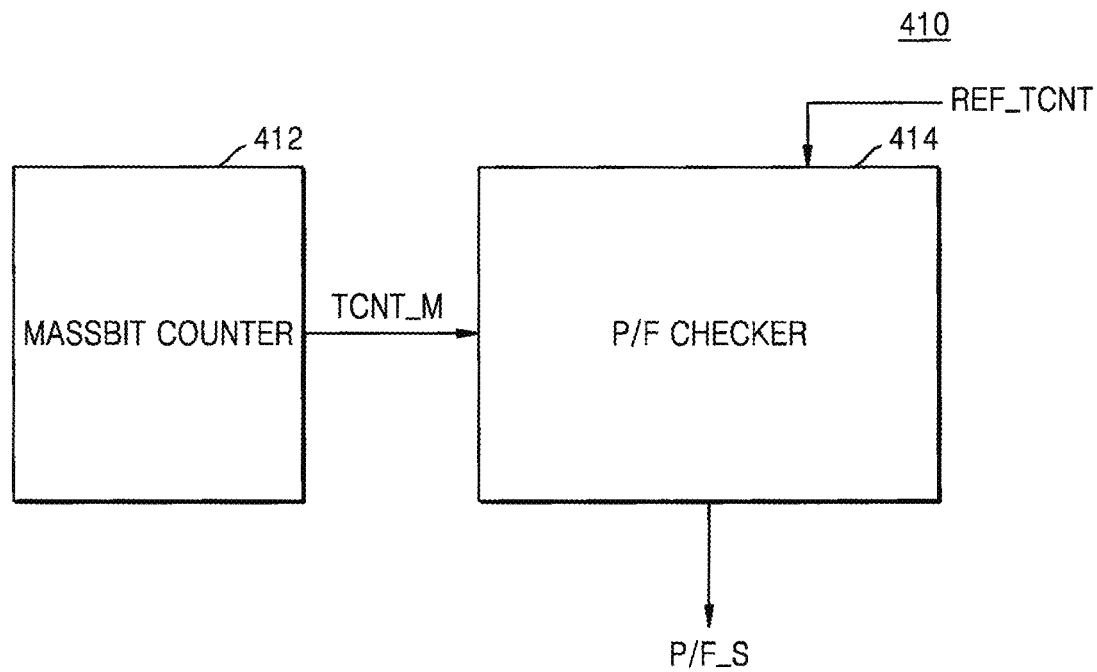
FIG. 15 is a block diagram for explaining an operation of determining whether a program operation passes or fails by using a total counting result value according to an example embodiment.

FIG. 15 is a block diagram for explaining an operation of determining whether a program operation passes or fails by using a total counting result value TCNT_M according to an example embodiment.

Referring to FIG. 15, a control logic 410 may include a massbit counter 412 and a pass/fail checker 414.

When a verify operation of one program loop is performed, the massbit counter 412 may generate the total counting result value TCNT_M, and may apply the total counting result value TCNT_M to the pass/fail checker 414. The pass/fail checker 414 may compare the total counting result value TCNT_M with a pass/fail reference value REF_TCNT, and may generate a pass/fail signal P/F_S by determining whether a program operation of the program loop passes or fails. The control logic 410 may determine whether to perform a next program loop based on the pass/fail signal P/F_S.

Figure 16A:
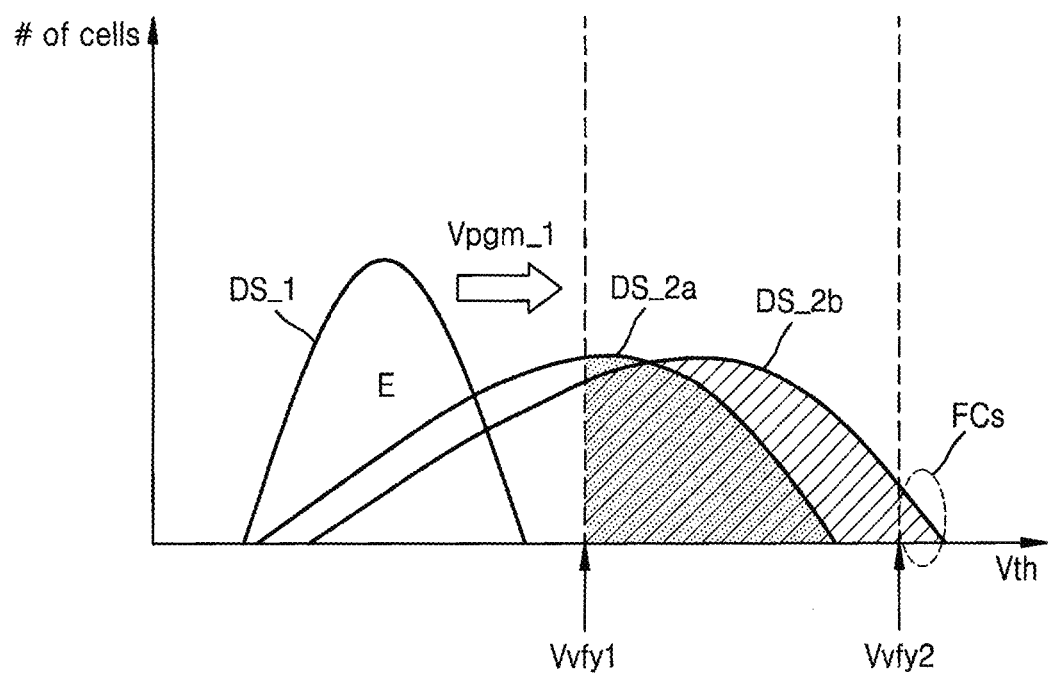
FIG. 16A is a diagram for explaining a purpose of controlling an initial program voltage level.
Figure 16B:
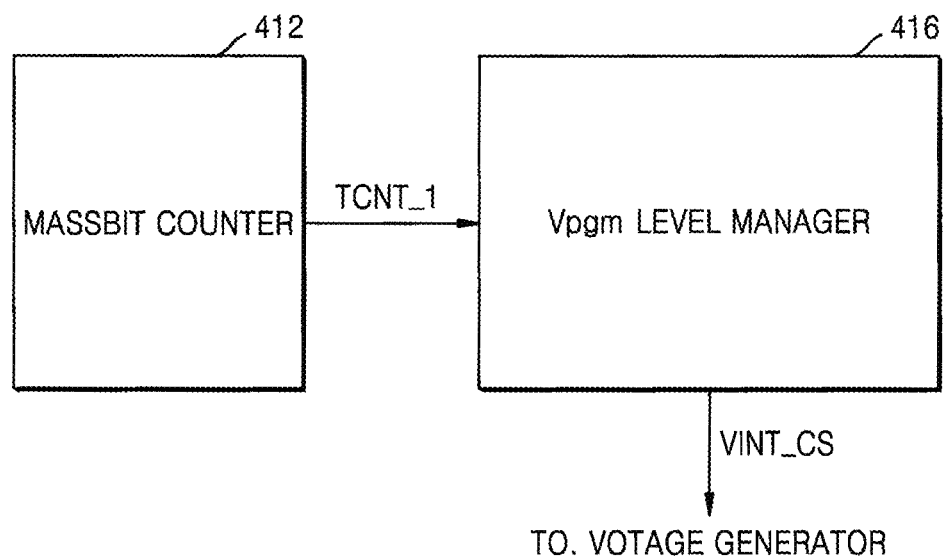
FIG. 16B is a block diagram for explaining an operation of controlling an initial program voltage level by using a first total counting result value according to an example embodiment.

FIG. 16A is a diagram for explaining a purpose of controlling an initial program voltage level. FIG. 16B is a block diagram for explaining an operation of controlling an initial program voltage level by using a first total counting result TCNT_1 according to an example embodiment. FIGS. 16A and 16B will be described based on the description of FIG. 4.

Referring to FIG. 16A, during the program operation PGM of the first program PL_1 in the erase state E, memory cells of a memory device may form a first threshold voltage distribution DS_2a or a second threshold voltage distribution DS_2b through the first program voltage Vpgm1. In this case, as shown in the second threshold voltage distribution DS_2b, since some fast cells FCs from among the memory cells may have a threshold voltage equal to or greater than the second verify voltage Vvfy2 for verifying the second program state P2 according to a level of the first program state P2, the fast cells FCs may act as program disturbance. In order to determine the existence of the fast cells FCs, a massbit counting operation that may indicate a difference between the actual number NUM_1 of off-cells having a threshold voltage equal to or greater than the first verify voltage Vvfy1 when the memory cells form the first threshold voltage distribution DS_2a and the actual number NUM_2 of off-cells having a threshold voltage equal to or greater than the first verify voltage Vvfy1 when the memory cells form the second threshold voltage distribution DS_2b is required.

Referring to FIG. 16B, the control logic 410 may include the massbit counter 412 and a program voltage level manager 416.

The massbit counter 412 may perform a massbit counting operation according to the verify operation VFY of the first program loop PL_1 based on a sampling rate or a scaling ratio that is higher than that when performing a massbit counting operation according to the verify operation VFY of any of the second through $H^{th}$ program loops PL_2 through PL_H. Accordingly, the massbit counter 412 may perform an off-cell counting operation that may check a difference between the actual numbers NUM_1 and NUM_2 of off-cells of FIG. 16A. The massbit counter 412 may apply the first total counting value TCNT_1 corresponding to the first program loop PL_1 to the program voltage level manager 416. The program voltage level manager 416 may adjust a first program voltage level by applying a first program voltage level control signal VINT_CS to a voltage generator based on the first total counting value TCNT_1.

Figure 17:
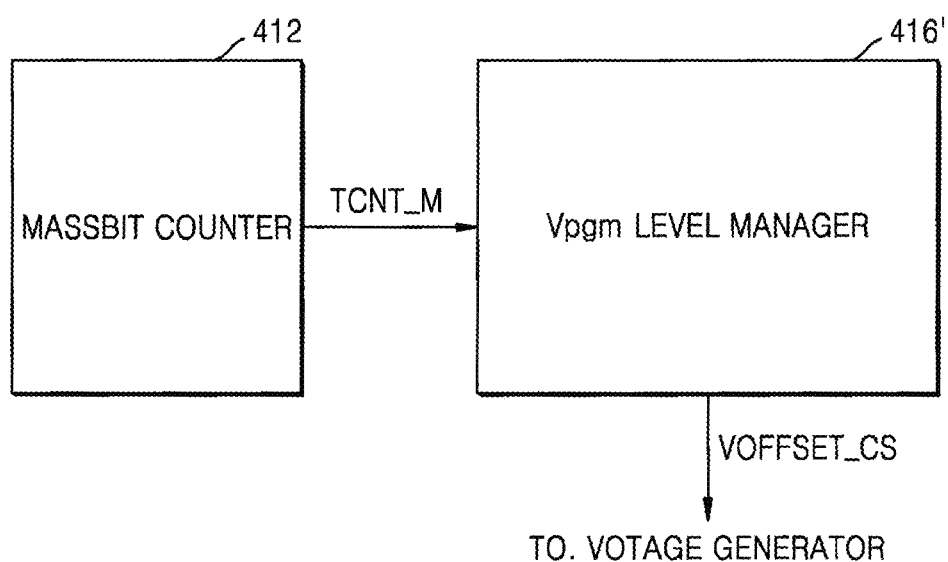
FIG. 17 is a block diagram for explaining an operation of controlling an offset voltage between program voltages in an incremental step pulse programming (ISPP) method by using a total counting result value according to an example embodiment.

FIG. 17 is a block diagram for explaining an operation of controlling an offset voltage between program voltages in an ISPP method by using the total counting result value TCNT_M according to an example embodiment. FIG. 17 will be described based on the description of FIG. 4.

Referring to FIG. 17, the control logic 410 may include the massbit counter 412 and a program voltage level manager 416'. The massbit counter 412 may perform a massbit counting operation according to the verify operation VFY of each of the first through $H^{th}$ program loops PL_1 through PL_H and may apply a total counting value TCNT<M> to the program voltage level manager 416'. The program voltage level manager 416' may adjust a level of the offset voltage OFFSET between program voltages by applying an offset voltage level control signal VOFFSET_CS to a voltage generator based on the total counting value TCNT<M>.

Figure 18A:
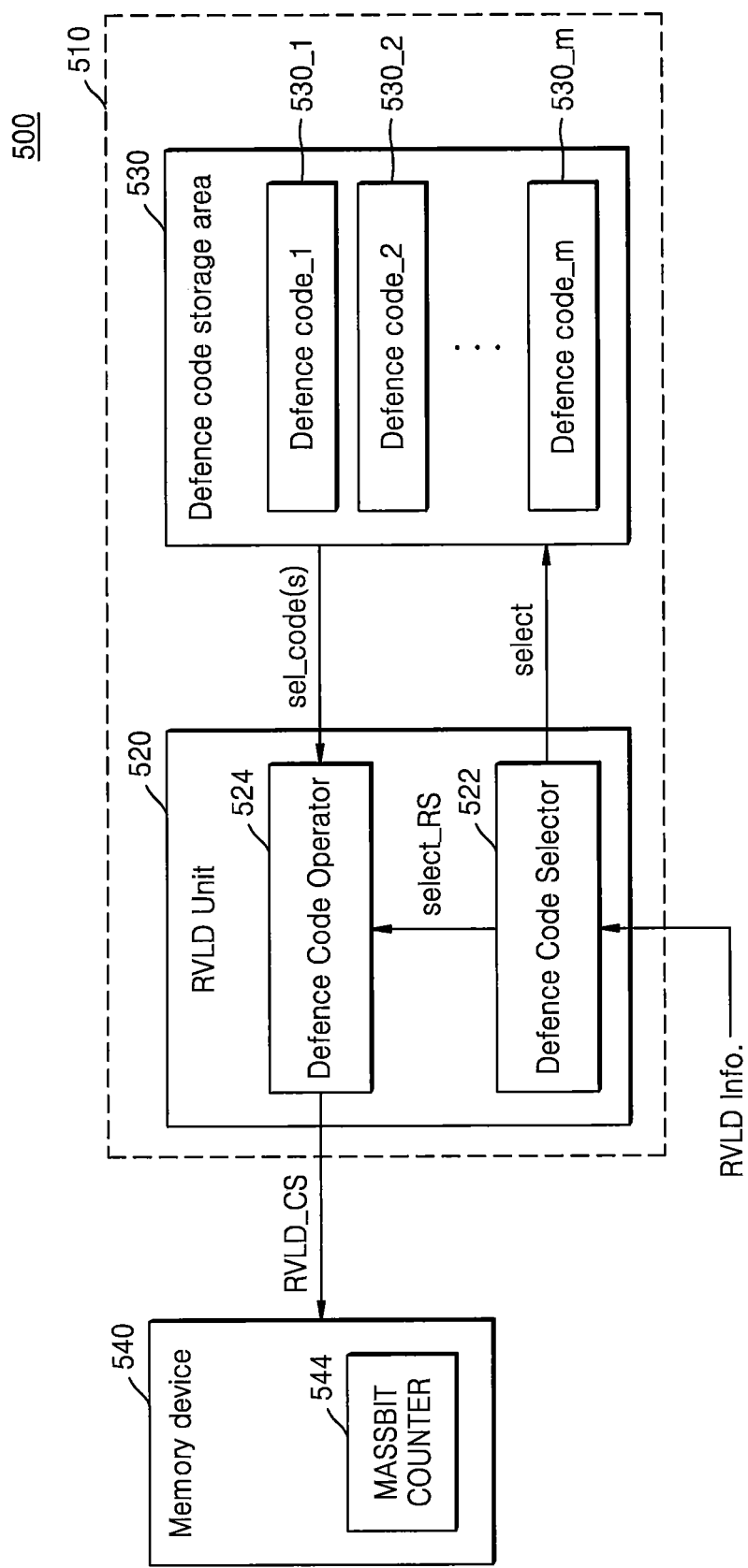
FIG. 18A is a block diagram of a memory system for executing a read defence code.
Figure 18B:
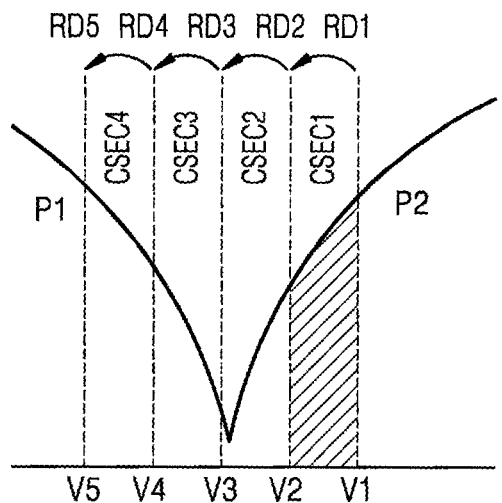
FIG. 18B is a diagram for explaining a method of determining a desired (or, alternatively, an optimal) read voltage by executing a read defence code.

FIG. 18A is a block diagram of a memory system 500 for executing a read defence code. FIG. 18B is a diagram for explaining a method of determining a desired (or, alternatively, an optimal) read voltage by executing a read defence code.

Referring to FIG. 18A, the memory system 500 may include a memory controller 510 and a memory device 540, and the memory controller 510 may include a read voltage level determiner 520 and a defence code storage area 530.

The read voltage level determiner 520 may include a defence code selector 522 and a defence code operator 524. The defence code selector 522 may select at least one from among a plurality of defence codes 530_1 through 530_m as a selected defence code sel_code(s). The defence code selector 522 may apply a result signal select_RS of the selected defence code sel_code(s) to the defence code operator 524. The defence code operator 524 may load the selected defence code sel_code(s) from the defence code storage area 530 and may execute the selected defence code sel_code(s). The defence code operator 524 may execute the selected defence code sel_code(s), may apply a control signal RVLD_CS to the memory device 540 based on the selected defence code sel_code(s), and may control the memory device 540 to perform a read voltage level determining operation.

The memory device 540 may use a massbit counter 544 to perform the read voltage level determining operation. In an example embodiment, the massbit counter 544 may perform the read level determining operation by changing a sampling rate or a scaling ratio to a value higher than a sampling rate or a scaling ratio on which a general verify operation is based.

Referring to FIG. 18B, the memory device 540 may read memory cells at first through fifth read voltages RD1 through RD5, and then, may count the number of memory cells included in each of cell sectors CSEC1 through CSEC4 by using the massbit counter 544. Since the massbit counter 544 that performs a massbit counting operation based on a high sampling rate or scaling ratio as described above may accurately count the number of memory cells included in each of the cell sectors CSE1 through CSE4, a desired (or, alternatively, an optimal) read voltage may be determined.

Figure 19:
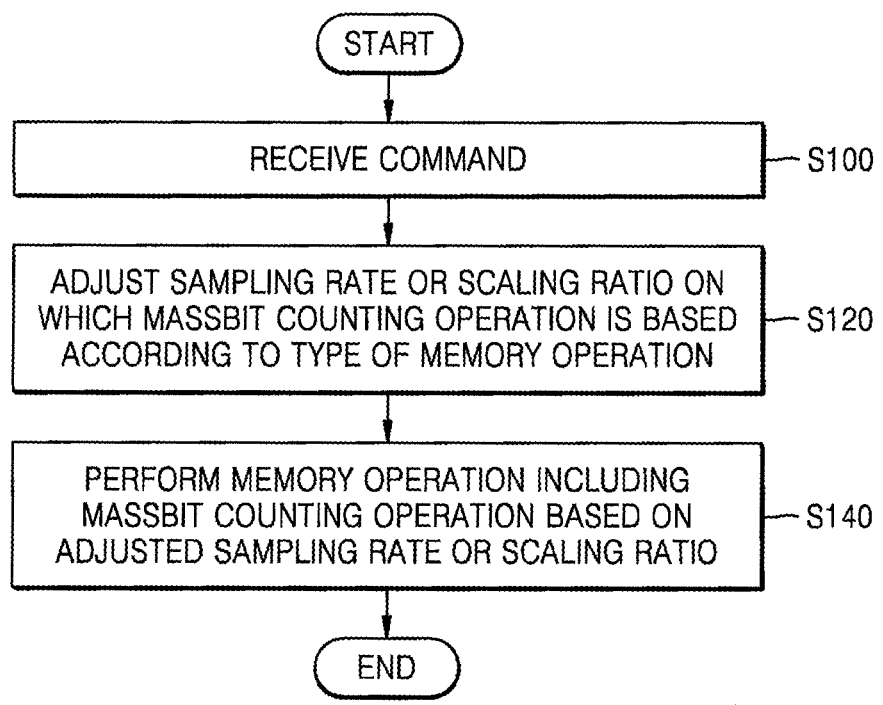
FIG. 19 is a flowchart for explaining a method of adjusting a sampling rate or a scaling ratio according to an example embodiment.

FIG. 19 is a flowchart for explaining a method of adjusting a sampling rate or a scaling ratio according to an example embodiment.

Referring to FIG. 19, in operation S100, a memory device may receive a command from a memory controller.

In operation S120, the memory device may adjust at least one of a sampling rate and a scaling ratio on which a massbit counting operation is based according to a type of a memory operation according to the command. For example, the memory device may increase a sampling rate or a scaling ratio when a memory operation requires a precise massbit counting operation. In contrast, the memory device may reduce a sampling rate or a scaling ratio when a memory operation is not affected by whether a rough massbit counting operation is performed. The adjustment of the sampling rate or scaling ratio will be discussed in more detail below with reference to FIGS. 20 and 21.

In operation S140, the memory device may perform a memory operation including a massbit counting operation based on the adjusted sampling rate or scaling ratio.

Figure 20:
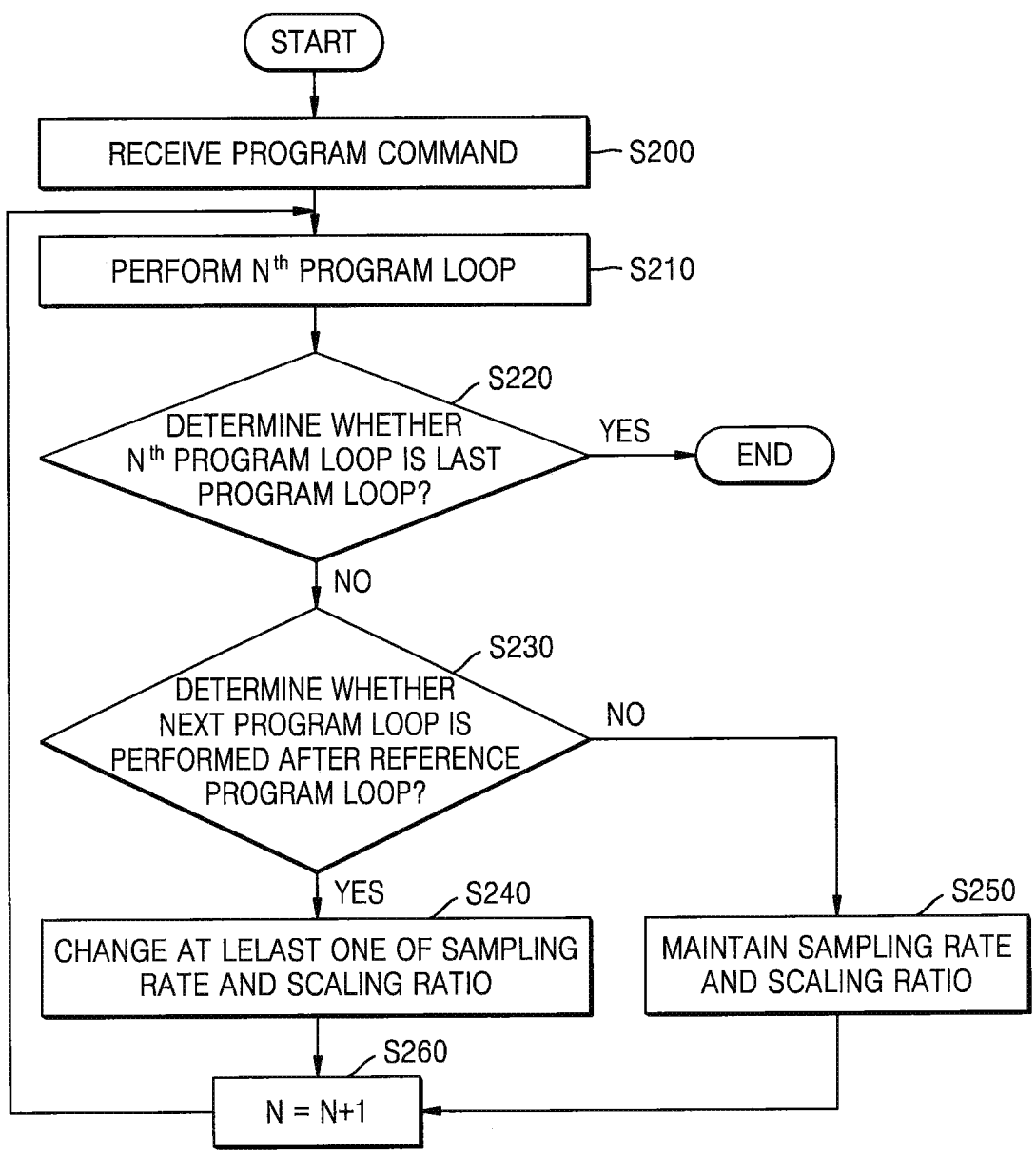
FIG. 20 is a flowchart for explaining a method of adjusting a sampling rate or a scaling ratio when a plurality of program loops are performed.

FIG. 20 is a flowchart for explaining a method of adjusting a sampling rate or a scaling ratio when a plurality of program loops are performed.

Referring to FIG. 20, in operation S200, a memory device may receive a program command from a memory controller. The memory device may perform a plurality of program loops in response to the program command.

In operation S210, the memory device may perform an $N^{th}$ program loop. In operation S220, the memory device may determine whether the $N^{th}$ program loop is a last program loop.

When it is determined in operation S220 that the $N^{th}$ program loop is the last program loop, a program operation in response to the program command may end. When it is determined in operation S220 that the $N^{th}$ program loop is not the last program loop, the method proceeds to operation S230.

In operation S230, the memory device may determine whether a next program loop is performed after a reference program loop.

When it is determined in operation S230 that the next program loop is performed after the reference program loop, the method proceeds to operation S240. In operation S240, the memory device may change at least one of a sampling rate and a scaling ratio.

When it is determined in operation S230 that the next program loop is performed before the reference program loop, the method proceeds to operation S250. In operation S250, the memory device may maintain the sampling rate and the scaling ratio. Since a precise massbit counting operation is required by an early program loop as described above, the early program loop may be performed by using a sampling rate or a scaling ratio that is higher than that in a late program loop performed after the reference program loop. Next, in operation S260, the memory device may increase N by 1 and may perform a next program loop.

Figure 21:
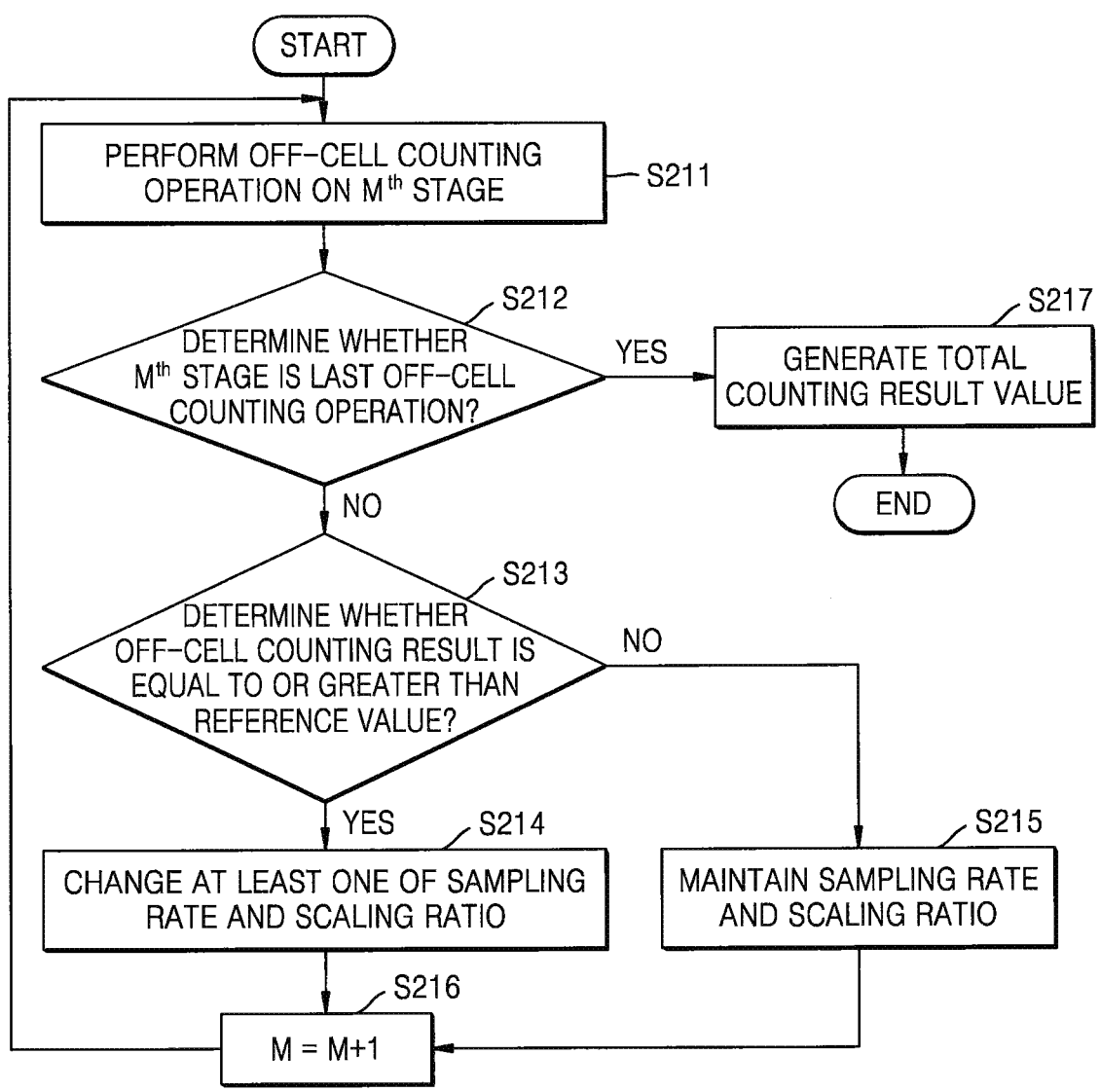
FIG. 21 is a flowchart for explaining a method of adjusting a sampling rate or a scaling ratio according to an off-cell counting result for each stage during a verify operation of one program loop.

FIG. 21 is a flowchart for explaining a method of adjusting a sampling rate or a scaling ratio according to an off-cell counting result for each stage during a verify operation of one program loop.

As described above, a memory device may perform a plurality of off-cell counting operations according to stages of a page buffer circuit in a verify operation of one program loop. The memory device may determine an appropriate sampling rate or scaling ratio by adjusting at least one of a sampling rate and a scaling ratio even in a verify operation of one program loop.

Referring to FIG. 21, in operation S211, the memory device may perform an off-cell counting operation on an $M^{th}$ stage.

In operation S212, the memory device may determine whether the off-cell counting operation on the $M^{th}$ stage is a last off-cell counting operation.

When it is determined in operation S212 that the off-cell counting operation is not the last off-cell counting operation, the method proceeds to operation S213.

In operation S213, the memory device may determine whether an off-cell counting result is equal to or greater than a reference value (or has an overflow value).

When it is determined in operation S213 that the off-cell counting result is equal to or greater than the reference value, the method proceeds to operation S214. In operation S214, the memory device may change at least one of a sampling rate and a scaling ratio to a lower value.

When it is determined in operation S213 that the off-cell counting result is less than the reference value, the method proceeds to operation S215. In operation S215, the sampling rate and the scaling ratio may be maintained.

Next, in operation S216, the memory device may increase M by 1 and may perform a next off-cell counting operation.

When it is determined in operation S212 that the off-cell counting operation on the $M^{th}$ stage is the last off-cell counting operation, the method proceeds to operation S217. In operation S217, the memory device may generate a total counting result value by using a plurality of off-cell counting results. The memory device may generate a total counting value in consideration of off-cell counting results equal to or greater than the reference value as described with reference to FIG. 14. Also, the memory device may perform a memory operation by using the total counting value as described with reference to FIGS. 15 through 18B.

Figures 22, 23A:
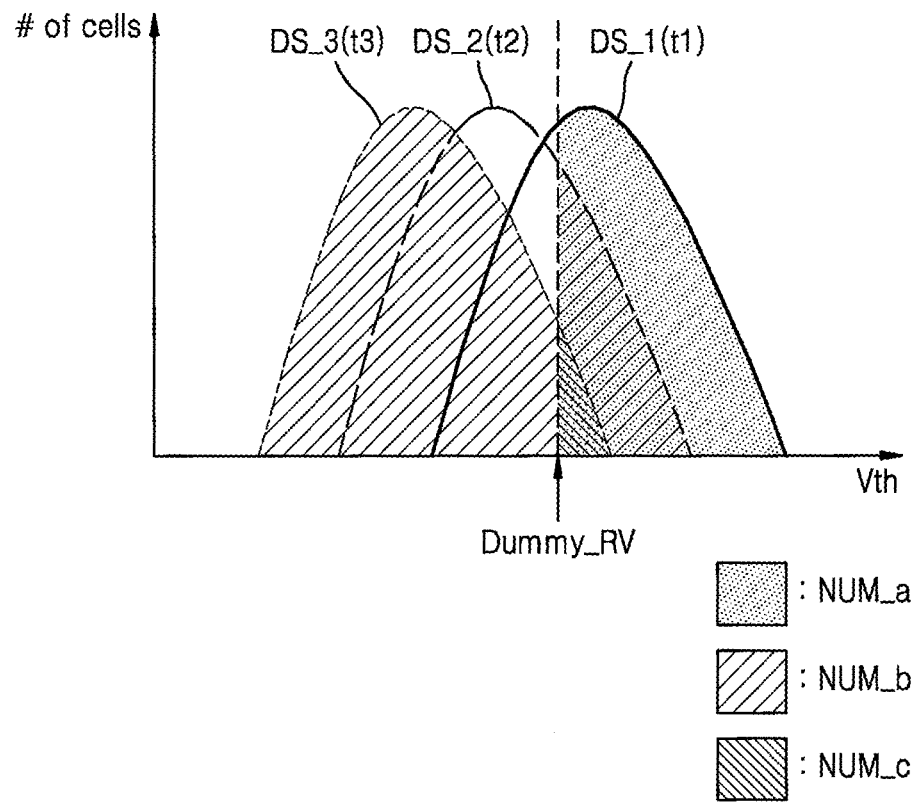

FIG. 22 is a diagram for explaining a dummy read operation performed before a read operation is performed.

Referring to FIGS. 2 and 22, the first threshold voltage distribution DS_1 of memory cells programmed to a desired (or, alternatively, a predetermined) program stage may be shifted to the second threshold voltage distribution DS_2 as a time 't1' is changed to a time 't2' according to retention characteristics of the memory cells. Also, the second threshold voltage distribution DS_2 may be shifted to a third threshold voltage distribution DS_3 as the time 't2' is changed to a time 't3'. The control logic 210 may control a dummy read operation.

In an example embodiment, the control logic 210 may control a dummy read voltage Dummy_RV to be applied to dummy to-be-read memory cells, and the massbit counter 212 may perform first off-cell counting based on a first sampling rate and a first scaling ratio. In an example embodiment, the dummy read voltage Dummy_RV may have a voltage level for determining a threshold voltage distribution tendency due to retention characteristics of memory cells having an uppermost program state. Accordingly, the dummy read voltage Dummy_RV may be set based on a read voltage for reading data of the memory cells having the uppermost program state. However, the inventive concept is not limited thereto, and the dummy read voltage Dummy_RV may be set to have any of various levels.

The massbit counter 212 may generate a result of a value 'NUM_a' when first off-cell counting is performed at the time 't1', may generate a result of a value 'NUM_b' when the first off-cell counting is performed at the time 't2', and may generate a result of a value 'NUM_c' when the first off-cell counting is performed at the time 't3'. The control logic 210 may obtain a first off-cell counting result from the massbit counter 212, may determine a tendency of a threshold voltage distribution according to retention characteristics of memory cells by using the first off-cell counting result, and may reflect the tendency to control a read operation.

In order to read data of memory cells having a desired (or, alternatively, a predetermined) state (e.g., a $k^{th}$ program state), the read operation may include applying a plurality of candidate read voltages to to-be-read memory cells and selecting a desired (or, alternatively an optimal) read voltage from among the candidate read voltages. The count management circuit 212B may set a second sampling rate and a second scaling ratio on which second off-cell counting performed by the massbit counter 212 is based in order to select a desired (or, alternatively, an optimal) read voltage based on the first off-cell counting result. In an example embodiment, the count management circuit 212B may set the second sampling rate and the second scaling ratio according to the first off-cell counting result by referring to a desired (or, alternatively, a predetermined) table, which will be described with reference to FIGS. 23A through 23C.

FIGS. 23A through 23C are diagrams illustrating table information TB_5a through TB_5c that are referred to in order to set a second sampling rate and a second scaling ratio on which second off-cell counting is based according to an example embodiment.

Referring to FIGS. 2 and 23A, the count management circuit 212B may set only a second sampling rate Sampling rate_2 by referring to the table information TB_5a. Accordingly, a second scaling ratio may be fixed to a preset value. For example, when a first off-cell counting result CNT_RS_1 is between a value 'NUM_1' and a value 'NUM_2', the count management circuit 212B may set the second sampling rate Sampling rate_2 to a value 'SR_1a'.

Referring to FIG. 23B, the count management circuit 212B may set only a second scaling ratio AMP ratio_2 by referring to the table information TB_5b. Accordingly, a second sampling rate may be fixed to a preset value. For example, when the first off-cell counting result CNT_RS_1 is between the value 'NUM_1' and the value 'NUM_2', the count management circuit 212B may set the second scaling ratio AMP ratio_2 to a value 'AR_1a'.

Referring to FIG. 23C, the count management circuit 212B may set the second sampling rate Sampling rate_2 and the second scaling ratio AMP ratio_2 by referring to the table information TB_5c. For example, when the first off-cell counting result CNT_RS_1 is between the value 'NUM_1' and the value 'NUM_2', the count management circuit 212B may set the second sampling rate Sampling rate_2 to a value 'SR_1b' and may set the second scaling ratio AMP ratio_2 to a value 'AR_1b'.

The count management circuit 212B may increase a value of at least one of the second sampling rate Sampling rate_2 and the second scaling ratio AMP Ratio_2 as a value of the first off-cell counting result CNT_RS_1 increases, that is, as the number of off-cells counted during a dummy read operation increases, by referring to the table information TB_5a through TB_5c. That is, it is found that when a value of the first off-cell counting result CNT_RS_1 is high, a shift degree of a threshold voltage distribution of memory cells is small. The massbit counter 212 may be required to perform more precise second off-cell counting in order to select an optimal read voltage during a read operation as a shift degree of a threshold voltage distribution of memory cells decreases. However, the inventive concept is not limited thereto, and the count management circuit 212B may reduce a value of at least one of the second sampling rate Sampling rate_2 and the second scaling ratio AMP Ratio_2 as a value of the first off-cell counting result CNT_RS_1 increases, by referring to the table information TB_5a through TB_5c.

Figure 24:
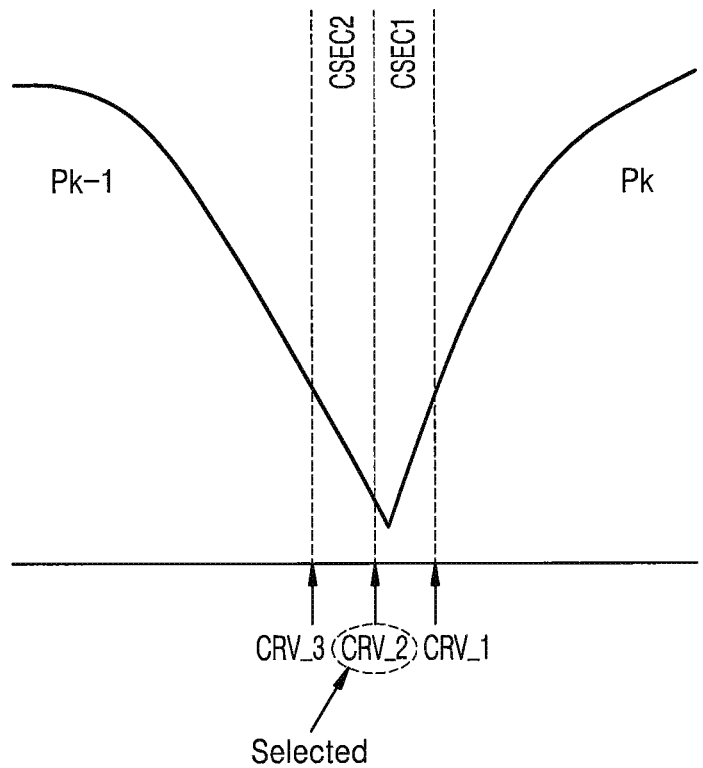
FIG. 24 is a diagram for explaining a method of selecting a desired (or, alternatively, an optimal) read voltage to read data of memory cells having a $k^{th}$ program state.

FIG. 24 is a diagram for explaining a method of selecting a desired (or, alternatively, an optimal) read voltage to read data of memory cells having a $k^{th}$ program state Pk.

Referring to FIGS. 2 and 24, the control logic 210 may control a plurality of candidate read voltages CRV_1 through CRV_3 to be sequentially applied to to-be-read memory cells, in order to read data of memory cells having the $k^{th}$ (k is an integer equal to or greater than 1) program state Pk. The massbit counter 212 may perform second off-cell counting a plurality of times based on a set second sampling rate and a set second scaling ratio, and the control logic 210 may obtain the number of memory cells included in each of cell sectors CSEC1 and CSEC2 by using second off-cell counting results. The control logic 210 may select a desired (or, alternatively, an optimal) read voltage (e.g., CRV_2) from among the candidate read voltages CRV_1 through CRV_3 based on the number of memory cells included in each of the cell sectors CSEC1 and CSEC2.

The selected read voltage CRV_2 may have a voltage level for accurately distinguishing memory cells having a $(k-1)^{th}$ program and the memory cells having the $k^{th}$ program state Pk. Next, the control logic 210 may control a read operation to be performed on the to-be-read memory cells by using the selected read voltage CRV_2.

Figure 25:
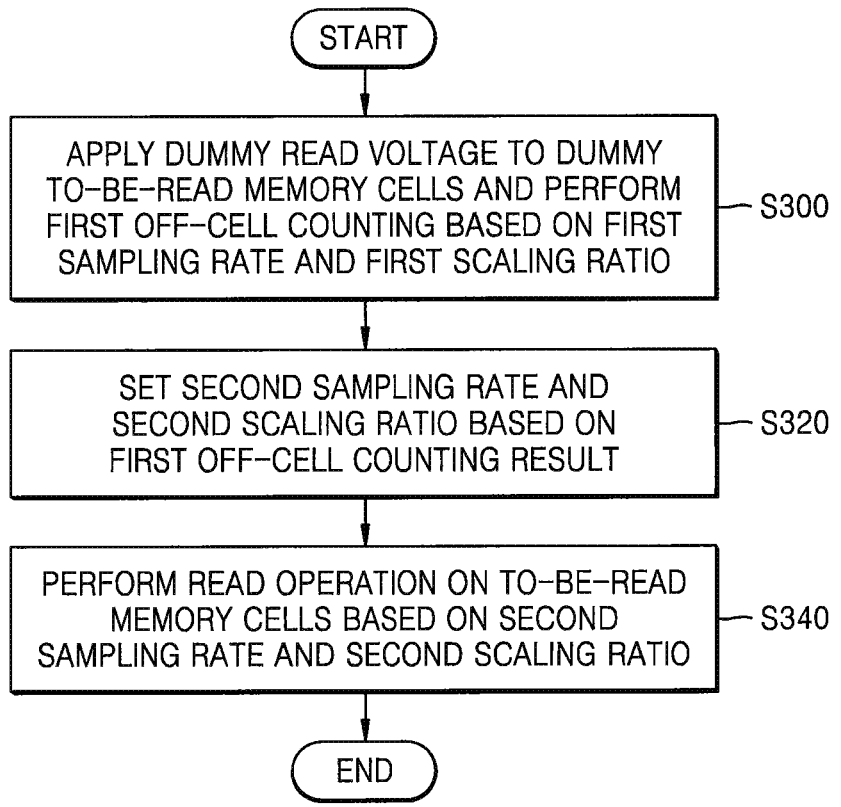
FIG. 25 is a flowchart for explaining an operation of a massbit counter according to an example embodiment.

FIG. 25 is a flowchart for explaining an operation of a massbit counter according to an example embodiment.

Referring to FIG. 25, in operation S300, a memory device according to an example embodiment may apply a dummy read voltage to dummy to-be-read memory cells from among memory cells included in a memory cell array and may perform first off-cell counting based on a first sampling rate and a first scaling ratio.

In operation S320, the memory device may set a second sampling rate and a second scaling ratio based on a first off-cell counting result.

In operation S340, the memory device may perform a read operation on to-be-read memory cells from among the memory cells included in the memory cell array based on a second sampling rate and a second scaling ratio.

Each operation of FIG. 25 has been described above, and thus a detailed explanation thereof will not be given.

While example embodiments of the inventive concepts have been particularly shown and described with reference to some example embodiments thereof, they are provided for the purposes of illustration and it will be understood by one of ordinary skill in the art that various modifications and equivalent other example embodiments may be made from the example embodiments of the inventive concepts. Accordingly, the true technical scope of example embodiments of the inventive concepts is defined by the technical spirit of the appended claims.

According to one or more example embodiments, the units and/or devices described above, such as the components of the control logic 210, 410 and the page buffer 220, 320 and the sub-components of each of the above such as the massbit count circuit 212A, 340, 412, the count management circuit 212B, 360 and the P/F checker 414, may be implemented using hardware, a combination of hardware and software, or a non-transitory storage medium storing software that is executable to perform the functions of the same. The control logic 210, 410 and the page buffer 220, 320 may be embodied in the same hardware platform or in separate hardware platforms.

Hardware may be implemented using processing circuitry such as, but not limited to, one or more processors, one or more Central Processing Units (CPUs), one or more controllers, one or more arithmetic logic units (ALUs), one or more digital signal processors (DSPs), one or more microcomputers, one or more field programmable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, etc., capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., one or more processors, CPUs, controllers, ALUs, DSPs, microcomputers, microprocessors, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor. In another example, the hardware device may be an integrated circuit customized into special purpose processing circuitry (e.g., an ASIC).

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Software and/or data may be embodied permanently or temporarily in any type of storage media including, but not limited to, any machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including tangible or non-transitory computer-readable storage media as discussed herein.

Storage media may also include one or more storage devices at units and/or devices according to one or more example embodiments. The one or more storage devices may be tangible or non-transitory computer-readable storage media, such as random access memory (RAM), read only memory (ROM), a permanent mass storage device (such as a disk drive), and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the storage media, the computer programs, program code, instructions, or some combination thereof, may be specially designed and constructed for the purposes of the example embodiments, or they may be known devices that are altered and/or modified for the purposes of example embodiments.

What is claimed is:

1. An apparatus comprising:
   a plurality of memory cells; and
   a controller coupled to the plurality of memory cells and configured to:
      perform a first programming loop including programming each of the plurality of memory cells to one of a plurality of first program states and verifying that one or more of the plurality of memory cells has a threshold voltage that is equal to or greater than one of a plurality of first verifying voltages corresponding to the plurality of first program states
      adjusting at least one of a sampling rate or a scaling ratio based on a result of the verifying that one or more of the plurality of memory cells has a threshold voltage that is equal to or greater than one of the plurality of first verifying voltages corresponding to the plurality of first program states, and
      perform a second programming loop including programming each of the plurality of memory cells to one of a plurality of second program states and verifying, using the at least one adjusted sampling rate or scaling ratio, that at least one of the plurality of memory cells has the threshold voltage that is equal to or greater than one of a plurality of second verify voltages corresponding to the plurality of second program states.

2. The apparatus of claim 1, wherein the controller iteratively programs each of the plurality of memory cells to one of the plurality of first program states, and iteratively programs each of the plurality of memory cells to one of the plurality of second program states.

3. The apparatus of claim 1, wherein the first programming loop ends before all of the plurality of memory cells are verified such that at least one of the plurality of memory cells are below one of the plurality of first verify voltages.

4. The apparatus of claim 1, wherein the controller counts the number of the plurality of memory cells having the threshold voltage that is equal to or greater than one of the plurality of first verify voltages, and continues programming, verifying and counting until the number is greater than a threshold number.

5. The apparatus of claim 4, wherein the controller determines the threshold number for each of the plurality of memory cells based on which of the plurality of second program states corresponds with each of the plurality of memory cells.

6. The apparatus of claim 1, wherein
   the controller selects one of a plurality of word lines and sets a first programming voltage for the first programming loop,
   the controller applies the first programming voltage to the selected one of the plurality of word lines, and
   the controller selects a first verification signal for one of the plurality of first program states and applies the first verification signal to the selected one of the plurality of word lines.

7. The apparatus of claim 6, wherein
   the controller selects one of the plurality of word lines and sets a second programming voltage for the second programming loop,
   the controller applies the second programming voltage to the selected one of the plurality of word lines, and
   the controller selects a second verification signal for one of the plurality of second program states and applies the second verification signal to the selected one of the plurality of word lines.

8. A controller in communication with a plurality of memory cells of a memory apparatus, the controller configured to:
   instruct the memory apparatus to perform a first programming loop including iteratively programming each of the plurality of memory cells to one of a plurality of first program states and to verify that one or more of the plurality of memory cells has a threshold voltage above one of a plurality of first verify voltages corresponding to the plurality of first program states;
   adjust at least one of a sampling rate or a scaling ratio based on a result of the verifying that one or more of the plurality of memory cells has the threshold voltage that is equal to or greater than one of a plurality of first verifying voltages corresponding to the plurality of first program states; and
   instruct the memory apparatus to perform a second programming loop including iteratively programming each of the plurality of memory cells to one of a plurality of second program states and to verify, using the at least one adjusted sampling rate or scaling ratio, that at least one of the plurality of memory cells has the threshold voltage above one of a plurality of second verify voltages corresponding to the plurality of second program states.

9. The controller of claim 8, wherein the first programming loop ends before all of the plurality of memory cells are verified such that at least one of the plurality of memory cells are below one of the plurality of first verify voltages.

10. The controller of claim 8, wherein the controller counts the number of the plurality of memory cells having the threshold voltage above one of the plurality of first verify voltages, and continues programming, verifying and counting until the number is greater than a threshold number.

11. The controller of claim 10, wherein the controller determines the threshold number for each of the plurality of memory cells based on which of the plurality of second program states corresponds with each of the plurality of memory cells.

12. The controller of claim 8, wherein
   the controller selects one of a plurality of word lines and sets a first programming voltage for the first programming loop,
   the controller applies the first programming voltage to the selected one of the plurality of word lines, and
   the controller selects a first verification signal for one of the plurality of first program states and applies the first verification signal to the selected one of the plurality of word lines.

13. The controller of claim 12, wherein
   the controller selects one of the plurality of word lines and sets a second programming voltage for the second programming loop,
   the controller applies the second programming voltage to the selected one of the plurality of word lines, and
   the controller selects a second verification signal for one of the plurality of second program states and applies the second verification signal to the selected one of the plurality of word lines.

14. A method of operating a memory apparatus including a plurality of memory cells, the method comprising:
   performing a first programming loop including programming each of the plurality of memory cells to one of a plurality of first program states and verifying that one or more of the plurality of memory cells has a threshold voltage above one of a plurality of first verify voltages corresponding to the plurality of first program states;

adjusting at least one of a sampling rate or a scaling ratio based on a result of the verifying that one or more of the plurality of memory cells has the threshold voltage that is equal to or greater than one of a plurality of first verifying voltages corresponding to the plurality of first program states; and performing a second programming loop including programming each of the plurality of memory cells to one of a plurality of second program states and verifying, using the at least one adjusted sampling rate or scaling ratio, that at least one of the plurality of memory cells has the threshold voltage above one of a plurality of second verify voltages corresponding to the plurality of second program states.

15. The method of claim 14, wherein the first programming loop includes iteratively programming each of the plurality of memory cells to one of the plurality of first program states, and iteratively programming each of the plurality of memory cells to one of the plurality of second program states.

16. The method of claim 14, wherein the first programming loop ends before all of the plurality of memory cells are verified such that at least one of the plurality of memory cells are below one of the plurality of first verify voltages.

17. The method of claim 14, further comprising:
counting the number of the plurality of memory cells having the threshold voltage that is greater than one of the plurality of first verify voltages; and
continuing programming, verifying and counting until the number is greater than a threshold number.

18. The method of claim 17, further comprising determining the threshold number for each of the plurality of memory cells based on which of the plurality of second program states corresponds with each of the plurality of memory cells.

19. The method of claim 14, further comprising:
selecting one of a plurality of word lines and setting a first programming voltage for the first programming loop;
applying the first programming voltage to the selected one of the plurality of word lines; and
selecting a first verification signal for one of the plurality of first program states and applying the first verification signal to the selected one of the plurality of word lines.

20. The method of claim 19, further comprising:
selecting one of the plurality of word lines and setting a second programming voltage for the second programming loop;
applying the second programming voltage to the selected one of the plurality of word lines; and
selecting a second verification signal for one of the plurality of second program states and applying the second verification signal to the selected one of the plurality of word lines.

* * * * *